United States Patent
Kirby et al.

(10) Patent No.: US 7,915,736 B2
(45) Date of Patent: Mar. 29, 2011

(54) MICROFEATURE WORKPIECES AND METHODS FOR FORMING INTERCONNECTS IN MICROFEATURE WORKPIECES

(75) Inventors: Kyle K. Kirby, Eagle, ID (US); William M. Hiatt, Eagle, ID (US); Richard L. Stocks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 11/832,742

(22) Filed: Aug. 2, 2007

(65) Prior Publication Data

US 2007/0267754 A1 Nov. 22, 2007

Related U.S. Application Data

(62) Division of application No. 11/218,243, filed on Sep. 1, 2005, now Pat. No. 7,262,134.

(51) Int. Cl.
*H01L 23/48* (2006.01)
*H01L 23/52* (2006.01)
*H01L 23/40* (2006.01)

(52) U.S. Cl. ... 257/774; 438/672; 438/675; 257/E23.01; 257/E21.305; 257/E21.49; 257/E21.575; 257/E21.597

(58) Field of Classification Search .......... None
See application file for complete search history.

(56) References Cited

U.S. PATENT DOCUMENTS

| | | | |
|---|---|---|---|
| 2,821,959 A | 2/1958 | Franz | |
| 3,006,318 A | 10/1961 | Monroe, Jr. et al. | |
| 3,345,134 A | 10/1967 | Heymer et al. | |
| 3,865,298 A | 2/1975 | Allen et al. | |
| 3,902,036 A | 8/1975 | Zaleckas | |
| 4,040,168 A | 8/1977 | Huang | |
| 4,368,106 A | 1/1983 | Anthony | |
| 4,534,100 A | 8/1985 | Lane | |
| 4,581,301 A | 4/1986 | Michaelson | |
| 4,608,480 A | 8/1986 | Bizot et al. | |
| 4,614,427 A | 9/1986 | Koizumi et al. | |
| 4,627,971 A | 12/1986 | Ayer | |
| 4,660,063 A | 4/1987 | Anthony | |

(Continued)

FOREIGN PATENT DOCUMENTS

DE 10205026 C1 5/2003

(Continued)

OTHER PUBLICATIONS

Aachboun, S. and P. Ranson, "Cryogenic etching of deep narrow trenches in silicon," J. Vac. Sci. Technol. A 18(4), Jul./Aug. 2000, pp. 1848-1852.

(Continued)

*Primary Examiner* — Jarrett J Stark
(74) *Attorney, Agent, or Firm* — Perkins Coie LLP

(57) ABSTRACT

Methods for forming interconnects in microfeature workpieces, and microfeature workpieces having such interconnects are disclosed herein. In one embodiment, a method of forming an interconnect in a microfeature workpiece includes forming a hole extending through a terminal and a dielectric layer to at least an intermediate depth in a substrate of a workpiece. The hole has a first lateral dimension in the dielectric layer and a second lateral dimension in the substrate proximate to an interface between the dielectric layer and the substrate. The second lateral dimension is greater than the first lateral dimension. The method further includes constructing an electrically conductive interconnect in at least a portion of the hole and in electrical contact with the terminal.

24 Claims, 25 Drawing Sheets

U.S. PATENT DOCUMENTS

| | | | |
|---|---|---|---|
| 4,756,765 A | 7/1988 | Woodroffe | |
| 4,818,728 A | 4/1989 | Rai et al. | |
| 4,906,314 A | 3/1990 | Farnworth et al. | |
| 4,907,127 A | 3/1990 | Lee | |
| 4,959,705 A | 9/1990 | Lemnios et al. | |
| 4,964,212 A | 10/1990 | Deroux-Dauphin et al. | |
| 5,006,922 A | 4/1991 | McShane et al. | |
| 5,024,966 A | 6/1991 | Dietrich et al. | |
| 5,026,964 A | 6/1991 | Somers et al. | |
| 5,027,184 A | 6/1991 | Soclof | |
| 5,037,782 A | 8/1991 | Nakamura et al. | |
| 5,098,864 A | 3/1992 | Mahulikar | |
| 5,102,829 A | 4/1992 | Cohn | |
| 5,123,902 A | 6/1992 | Muller et al. | |
| 5,130,783 A | 7/1992 | McLellan | |
| 5,144,412 A | 9/1992 | Chang et al. | |
| 5,145,099 A | 9/1992 | Wood et al. | |
| 5,158,911 A | 10/1992 | Quentin | |
| 5,200,366 A | 4/1993 | Yamada et al. | |
| 5,219,344 A | 6/1993 | Yoder, Jr. | |
| 5,233,448 A | 8/1993 | Wu et al. | |
| 5,237,148 A | 8/1993 | Aoki et al. | |
| 5,289,631 A | 3/1994 | Koopman et al. | |
| 5,291,062 A | 3/1994 | Higgins, III | |
| 5,292,686 A | 3/1994 | Riley et al. | |
| 5,304,743 A | 4/1994 | Sen et al. | |
| 5,371,397 A | 12/1994 | Maegawa et al. | |
| 5,378,312 A | 1/1995 | Gifford et al. | |
| 5,378,313 A | 1/1995 | Pace | |
| 5,380,681 A | 1/1995 | Hsu et al. | |
| 5,402,435 A | 3/1995 | Shiono et al. | |
| 5,406,630 A | 4/1995 | Piosenka et al. | |
| 5,424,573 A | 6/1995 | Kato et al. | |
| 5,435,887 A | 7/1995 | Rothschild et al. | |
| 5,438,212 A | 8/1995 | Okaniwa et al. | |
| 5,447,871 A | 9/1995 | Goldstein | |
| 5,464,960 A | 11/1995 | Hall et al. | |
| 5,481,483 A | 1/1996 | Ebenstein | |
| 5,485,039 A | 1/1996 | Fujita et al. | |
| 5,496,755 A | 3/1996 | Bayraktaroglu | |
| 5,505,804 A | 4/1996 | Mizuguchi et al. | |
| 5,515,167 A | 5/1996 | Ledger et al. | |
| 5,518,956 A | 5/1996 | Liu et al. | |
| 5,531,022 A | 7/1996 | Beaman et al. | |
| 5,550,403 A | 8/1996 | Carichner | |
| 5,585,308 A | 12/1996 | Sardella | |
| 5,585,675 A | 12/1996 | Knopf | |
| 5,593,913 A | 1/1997 | Aoki | |
| 5,605,783 A | 2/1997 | Revelli et al. | |
| 5,614,743 A | 3/1997 | Mochizuki et al. | |
| 5,618,752 A | 4/1997 | Gaul | |
| 5,624,437 A | 4/1997 | Freeman et al. | |
| 5,627,106 A | 5/1997 | Hsu et al. | |
| 5,646,067 A | 7/1997 | Gaul | |
| 5,654,221 A | 8/1997 | Cronin et al. | |
| 5,672,519 A | 9/1997 | Song et al. | |
| 5,673,846 A | 10/1997 | Gruber | |
| 5,684,642 A | 11/1997 | Zumoto et al. | |
| 5,690,841 A | 11/1997 | Elderstig et al. | |
| 5,694,246 A | 12/1997 | Aoyama et al. | |
| 5,708,293 A | 1/1998 | Ochi et al. | |
| 5,718,791 A | 2/1998 | Spengler et al. | |
| 5,723,904 A | 3/1998 | Shiga | |
| 5,726,493 A | 3/1998 | Yamashita et al. | |
| 5,734,555 A | 3/1998 | McMahon | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,825,080 A | 10/1998 | Imaoka et al. | |
| 5,826,628 A | 10/1998 | Hamilton | |
| 5,847,454 A | 12/1998 | Shaw et al. | |
| 5,851,845 A | 12/1998 | Wood et al. | |
| 5,857,963 A | 1/1999 | Pelchy et al. | |
| 5,861,654 A | 1/1999 | Johnson | |
| 5,870,289 A | 2/1999 | Tokuda et al. | |
| 5,870,823 A | 2/1999 | Bezama et al. | |
| 5,877,040 A | 3/1999 | Park et al. | |
| 5,893,828 A | 4/1999 | Uram | |
| 5,897,338 A | 4/1999 | Kaldenberg | |
| 5,904,499 A | 5/1999 | Pace | |
| 5,914,488 A | 6/1999 | Sone | |
| 5,969,422 A | 10/1999 | Ting et al. | |
| 5,977,535 A | 11/1999 | Rostoker | |
| 5,998,240 A | 12/1999 | Hamilton et al. | |
| 5,998,292 A | 12/1999 | Black et al. | |
| 5,998,862 A | 12/1999 | Yamanaka | |
| 6,004,867 A | 12/1999 | Kim et al. | |
| 6,008,070 A | 12/1999 | Farnworth | |
| 6,008,914 A | 12/1999 | Sasagawa et al. | |
| 6,080,291 A | 6/2000 | Woodruff et al. | |
| 6,097,087 A | 8/2000 | Farnworth et al. | |
| 6,103,547 A | 8/2000 | Corisis et al. | |
| 6,104,086 A | 8/2000 | Ichikawa et al. | |
| 6,107,186 A | 8/2000 | Erb | |
| 6,107,679 A | 8/2000 | Noguchi | |
| 6,110,825 A | 8/2000 | Mastromatteo et al. | |
| 6,114,240 A | 9/2000 | Akram et al. | |
| 6,119,335 A | 9/2000 | Park et al. | |
| 6,124,634 A | 9/2000 | Akram et al. | |
| 6,133,622 A | 10/2000 | Corisis et al. | |
| 6,137,163 A | 10/2000 | Kim et al. | |
| 6,137,182 A | 10/2000 | Hause et al. | |
| 6,140,604 A | 10/2000 | Somers et al. | |
| 6,143,588 A | 11/2000 | Glenn | |
| 6,148,509 A | 11/2000 | Schoenfeld et al. | |
| 6,159,764 A | 12/2000 | Kinsman et al. | |
| 6,180,518 B1 | 1/2001 | Layadi et al. | |
| 6,184,060 B1 | 2/2001 | Siniaguine | |
| 6,184,465 B1 | 2/2001 | Corisis | |
| 6,187,615 B1 | 2/2001 | Kim et al. | |
| 6,191,487 B1 | 2/2001 | Rodenbeck et al. | |
| 6,203,539 B1 | 3/2001 | Shimmick et al. | |
| 6,221,769 B1 | 4/2001 | Dhong et al. | |
| 6,222,136 B1 | 4/2001 | Appelt et al. | |
| 6,222,270 B1 | 4/2001 | Lee et al. | |
| 6,228,687 B1 | 5/2001 | Akram et al. | |
| 6,229,202 B1 | 5/2001 | Corisis | |
| 6,235,552 B1 | 5/2001 | Kwon et al. | |
| 6,236,046 B1 | 5/2001 | Watabe et al. | |
| 6,246,108 B1 | 6/2001 | Corisis et al. | |
| 6,252,300 B1 | 6/2001 | Hsuan et al. | |
| 6,259,083 B1 | 7/2001 | Kimura | |
| 6,260,259 B1 | 7/2001 | Kajii | |
| 6,266,197 B1 | 7/2001 | Glenn et al. | |
| 6,271,580 B1 | 8/2001 | Corisis | |
| 6,274,927 B1 | 8/2001 | Glenn | |
| 6,277,757 B1 | 8/2001 | Lin et al. | |
| 6,285,064 B1 | 9/2001 | Foster | |
| 6,291,894 B1 | 9/2001 | Farnworth et al. | |
| 6,294,837 B1 | 9/2001 | Akram et al. | |
| 6,297,155 B1 | 10/2001 | Simpson et al. | |
| 6,324,253 B1 | 11/2001 | Yuyama et al. | |
| 6,326,689 B1 | 12/2001 | Thomas | |
| 6,326,697 B1 | 12/2001 | Farnworth | |
| 6,329,632 B1 | 12/2001 | Fournier et al. | |
| 6,341,009 B1 | 1/2002 | O'Connor et al. | |
| 6,344,976 B1 | 2/2002 | Schoenfeld et al. | |
| 6,346,479 B1 | 2/2002 | Woo et al. | |
| 6,351,027 B1 | 2/2002 | Giboney et al. | |
| 6,359,254 B1 | 3/2002 | Brown | |
| 6,359,328 B1 | 3/2002 | Dubin | |
| 6,372,548 B2 | 4/2002 | Bessho et al. | |
| 6,388,208 B1 | 5/2002 | Kiani et al. | |
| 6,391,770 B2 | 5/2002 | Kosaki et al. | |
| 6,400,172 B1 | 6/2002 | Akram et al. | |
| 6,406,636 B1 | 6/2002 | Vaganov | |
| 6,407,381 B1 | 6/2002 | Glenn et al. | |
| 6,411,439 B2 | 6/2002 | Nishikawa | |
| 6,432,821 B1 | 8/2002 | Dubin et al. | |
| 6,433,303 B1 | 8/2002 | Liu et al. | |
| 6,433,304 B2 | 8/2002 | Okumura et al. | |
| 6,437,284 B1 | 8/2002 | Okamoto et al. | |
| 6,437,441 B1 | 8/2002 | Yamamoto et al. | |
| 6,444,576 B1 | 9/2002 | Kong | |
| 6,448,106 B1 | 9/2002 | Wang et al. | |
| 6,455,425 B1 | 9/2002 | Besser et al. | |

| Patent No. | Date | Inventor |
|---|---|---|
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Iacoponi et al. |
| 6,483,652 B2 | 11/2002 | Nakamura |
| 6,486,549 B1 | 11/2002 | Chiang et al. |
| 6,503,780 B1 | 1/2003 | Glenn et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,541,762 B2 | 4/2003 | Knag et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,168 B1 | 7/2003 | Ehrichs et al. |
| 6,593,644 B2 | 7/2003 | Chiu et al. |
| 6,599,436 B1 | 7/2003 | Matzke et al. |
| 6,603,183 B1 | 8/2003 | Hoffman |
| 6,606,251 B1 | 8/2003 | Kenny, Jr. et al. |
| 6,611,050 B1 | 8/2003 | Ference et al. |
| 6,614,033 B2 | 9/2003 | Suguro et al. |
| 6,617,623 B2 | 9/2003 | Rhodes |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,670,986 B1 | 12/2003 | Ben Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,734,419 B1 | 5/2004 | Glenn et al. |
| 6,746,971 B1 | 6/2004 | Ngo et al. |
| 6,750,144 B2 | 6/2004 | Taylor |
| 6,756,564 B2 | 6/2004 | Tian |
| 6,759,266 B1 | 7/2004 | Hoffman |
| 6,774,486 B2 | 8/2004 | Kinsman |
| 6,777,244 B2 | 8/2004 | Pepper et al. |
| 6,778,046 B2 | 8/2004 | Stafford et al. |
| 6,780,749 B2 | 8/2004 | Masumoto et al. |
| 6,790,775 B2 | 9/2004 | Fartash |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,809,025 B2 | 10/2004 | Sandhu et al. |
| 6,809,421 B1 | 10/2004 | Hayasaka et al. |
| 6,813,154 B2 | 11/2004 | Diaz et al. |
| 6,818,464 B2 | 11/2004 | Heschel et al. |
| 6,825,458 B1 | 11/2004 | Moess et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,828,663 B2 | 12/2004 | Chen et al. |
| 6,828,674 B2 | 12/2004 | Karpman |
| 6,838,377 B2 | 1/2005 | Tonami et al. |
| 6,841,849 B2 | 1/2005 | Miyazawa |
| 6,844,978 B2 | 1/2005 | Harden et al. |
| 6,847,109 B2 | 1/2005 | Shim |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,021 B2 | 4/2005 | Boon et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,934,065 B2 | 8/2005 | Kinsman |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,111,149 B2 | 9/2006 | Eilert |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,189,954 B2 | 3/2007 | Farnworth et al. |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,368 B2 | 8/2007 | Haba et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |
| 7,378,726 B2 | 5/2008 | Punzalan et al. |
| 7,408,265 B2 | 8/2008 | Holscher et al. |
| 7,449,098 B1 | 11/2008 | Mayer et al. |
| 7,491,582 B2 | 2/2009 | Yokoyama et al. |
| 7,498,661 B2 | 3/2009 | Matsuo |
| 7,709,958 B2 | 5/2010 | Cohen |
| 7,793,414 B2 | 9/2010 | Haba et al. |
| 2001/0000013 A1 | 3/2001 | Lin |
| 2001/0020739 A1 | 9/2001 | Honda |
| 2002/0005583 A1 | 1/2002 | Harada et al. |
| 2002/0006687 A1 | 1/2002 | Lam |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0084513 A1 | 7/2002 | Siniaguine |

| | | | | | | |
|---|---|---|---|---|---|---|
| 2002/0089025 A1 | 7/2002 | Chou | | 2005/0247894 A1 | 11/2005 | Watkins et al. |
| 2002/0094607 A1 | 7/2002 | Gebauer et al. | | 2005/0253213 A1 | 11/2005 | Jiang et al. |
| 2002/0096729 A1 | 7/2002 | Tu et al. | | 2005/0254133 A1 | 11/2005 | Akram et al. |
| 2002/0113296 A1 | 8/2002 | Cho et al. | | 2005/0258530 A1 | 11/2005 | Vindasius et al. |
| 2002/0117399 A1 | 8/2002 | Chen et al. | | 2005/0270651 A1 | 12/2005 | Boettiger et al. |
| 2002/0130390 A1 | 9/2002 | Ker et al. | | 2005/0272221 A1 | 12/2005 | Yen et al. |
| 2002/0145676 A1 | 10/2002 | Kuno et al. | | 2005/0275048 A1 | 12/2005 | Farnworth et al. |
| 2002/0190371 A1 | 12/2002 | Mashino et al. | | 2005/0275049 A1 | 12/2005 | Kirby et al. |
| 2003/0014895 A1 | 1/2003 | Lizotte | | 2005/0275051 A1 | 12/2005 | Farnworth et al. |
| 2003/0042564 A1 | 3/2003 | Taniguchi et al. | | 2005/0275750 A1 | 12/2005 | Akram et al. |
| 2003/0045085 A1 | 3/2003 | Taniguchi et al. | | 2005/0277293 A1 | 12/2005 | Kim et al. |
| 2003/0062601 A1 | 4/2003 | Harnden et al. | | 2005/0282374 A1 | 12/2005 | Hwang et al. |
| 2003/0109140 A1 | 6/2003 | Lee | | 2005/0285154 A1 | 12/2005 | Akram et al. |
| 2003/0119308 A1 | 6/2003 | Geefay et al. | | 2006/0003566 A1 | 1/2006 | Emesh |
| 2003/0137058 A1 | 7/2003 | Magerlein et al. | | 2006/0011809 A1 | 1/2006 | Farnworth et al. |
| 2003/0148597 A1 | 8/2003 | Tan et al. | | 2006/0014313 A1 | 1/2006 | Hall et al. |
| 2003/0175146 A1 | 9/2003 | Yeh et al. | | 2006/0023107 A1 | 2/2006 | Bolken et al. |
| 2003/0199119 A1 | 10/2003 | Lin | | 2006/0024856 A1 | 2/2006 | Derderian et al. |
| 2003/0216023 A1 | 11/2003 | Wark et al. | | 2006/0035402 A1 | 2/2006 | Street et al. |
| 2004/0004280 A1 | 1/2004 | Shibata | | 2006/0035415 A1 | 2/2006 | Wood et al. |
| 2004/0012698 A1 | 1/2004 | Suda | | 2006/0038183 A1 | 2/2006 | Oliver |
| 2004/0016942 A1 | 1/2004 | Miyazawa et al. | | 2006/0038272 A1 | 2/2006 | Edwards |
| 2004/0018712 A1 | 1/2004 | Plas et al. | | 2006/0040421 A1 | 2/2006 | Farnworth et al. |
| 2004/0023447 A1 | 2/2004 | Hirakata et al. | | 2006/0040428 A1 | 2/2006 | Johnson |
| 2004/0023469 A1 | 2/2004 | Suda | | 2006/0042952 A1 | 3/2006 | Oliver et al. |
| 2004/0038442 A1 | 2/2004 | Kinsman | | 2006/0043262 A1 | 3/2006 | Akram |
| 2004/0041261 A1 | 3/2004 | Kinsman | | 2006/0043509 A1 | 3/2006 | Watkins et al. |
| 2004/0043607 A1 | 3/2004 | Farnworth et al. | | 2006/0043512 A1 | 3/2006 | Oliver et al. |
| 2004/0046251 A1 | 3/2004 | Lee | | 2006/0043535 A1 | 3/2006 | Hiatt |
| 2004/0073607 A1 | 4/2004 | Su et al. | | 2006/0043569 A1 | 3/2006 | Benson et al. |
| 2004/0082094 A1 | 4/2004 | Yamamoto | | 2006/0043599 A1 | 3/2006 | Akram et al. |
| 2004/0087441 A1 | 5/2004 | Bock et al. | | 2006/0044433 A1 | 3/2006 | Akram |
| 2004/0094389 A1 | 5/2004 | Boyce | | 2006/0046332 A1 | 3/2006 | Derderian et al. |
| 2004/0137661 A1 | 7/2004 | Murayama | | 2006/0046438 A1 | 3/2006 | Kirby |
| 2004/0137701 A1 | 7/2004 | Takao | | 2006/0046468 A1 | 3/2006 | Akram et al. |
| 2004/0141536 A1 | 7/2004 | Liu et al. | | 2006/0046471 A1 | 3/2006 | Kirby et al. |
| 2004/0159668 A1 | 8/2004 | Vasiadis | | 2006/0057776 A1 | 3/2006 | Tao |
| 2004/0159958 A1 | 8/2004 | Funaki | | 2006/0057836 A1 | 3/2006 | Nagarajan et al. |
| 2004/0178491 A1 | 9/2004 | Akram et al. | | 2006/0071347 A1 | 4/2006 | Dotta |
| 2004/0180539 A1 | 9/2004 | Yamamoto et al. | | 2006/0148250 A1 | 7/2006 | Kirby |
| 2004/0188260 A1 | 9/2004 | Bonkabeta et al. | | 2006/0151880 A1 | 7/2006 | Tang et al. |
| 2004/0192033 A1 | 9/2004 | Hara | | 2006/0154153 A1 | 7/2006 | Chiang et al. |
| 2004/0198033 A1 | 10/2004 | Lee et al. | | 2006/0160367 A1 | 7/2006 | Wai et al. |
| 2004/0198040 A1 | 10/2004 | Geefay et al. | | 2006/0175532 A1 | 8/2006 | Boemler |
| 2004/0214373 A1 | 10/2004 | Jiang et al. | | 2006/0177959 A1 | 8/2006 | Boettiger et al. |
| 2004/0219342 A1 | 11/2004 | Boggs et al. | | 2006/0177999 A1 | 8/2006 | Hembree et al. |
| 2004/0219763 A1 | 11/2004 | Kim et al. | | 2006/0180941 A1 | 8/2006 | Kirby et al. |
| 2004/0222082 A1 | 11/2004 | Gopalraja et al. | | 2006/0186097 A1 | 8/2006 | Watkins et al. |
| 2004/0245649 A1 | 12/2004 | Imaoka | | 2006/0186492 A1 | 8/2006 | Boettiger et al. |
| 2004/0255258 A1 | 12/2004 | Li | | 2006/0191882 A1 | 8/2006 | Watkins et al. |
| 2004/0262753 A1 | 12/2004 | Kashiwazaki | | 2006/0195729 A1 | 8/2006 | Huppenthal et al. |
| 2004/0265562 A1 | 12/2004 | Uzoh et al. | | 2006/0199363 A1 | 9/2006 | Kirby et al. |
| 2005/0026443 A1 | 2/2005 | Goo et al. | | 2006/0204651 A1 | 9/2006 | Wai et al. |
| 2005/0037608 A1 | 2/2005 | Andricacos et al. | | 2006/0208360 A1 | 9/2006 | Yiu et al. |
| 2005/0046002 A1 | 3/2005 | Lee et al. | | 2006/0216862 A1 | 9/2006 | Rigg et al. |
| 2005/0052751 A1 | 3/2005 | Liu et al. | | 2006/0223301 A1 | 10/2006 | Vanhaelemeersch et al. |
| 2005/0064707 A1 | 3/2005 | Sinha | | 2006/0249849 A1 | 11/2006 | Cohen |
| 2005/0067620 A1 | 3/2005 | Chan et al. | | 2006/0252254 A1 | 11/2006 | Basol |
| 2005/0069782 A1 | 3/2005 | Elenius et al. | | 2006/0252262 A1 | 11/2006 | Kazemi |
| 2005/0101054 A1 | 5/2005 | Mastromatteo et al. | | 2006/0255443 A1 | 11/2006 | Hwang et al. |
| 2005/0101116 A1 | 5/2005 | Tseng | | 2006/0264041 A1 | 11/2006 | Rigg et al. |
| 2005/0104228 A1 | 5/2005 | Rigg et al. | | 2006/0270108 A1 | 11/2006 | Farnworth et al. |
| 2005/0106834 A1 | 5/2005 | Andry et al. | | 2006/0278979 A1 | 12/2006 | Rangel |
| 2005/0110095 A1 | 5/2005 | Shih et al. | | 2006/0278980 A1 | 12/2006 | Trezza et al. |
| 2005/0110889 A1 | 5/2005 | Tuttle et al. | | 2006/0278988 A1 | 12/2006 | Trezza et al. |
| 2005/0127478 A1 | 6/2005 | Hiatt et al. | | 2006/0278989 A1 | 12/2006 | Trezza |
| 2005/0136646 A1 | 6/2005 | Larnerd et al. | | 2006/0281224 A1 | 12/2006 | Edelstein et al. |
| 2005/0139390 A1 | 6/2005 | Kim et al. | | 2006/0281243 A1 | 12/2006 | Trezza |
| 2005/0150683 A1 | 7/2005 | Farnworth et al. | | 2006/0289967 A1 | 12/2006 | Heck et al. |
| 2005/0151228 A1 | 7/2005 | Tanida et al. | | 2006/0289968 A1 | 12/2006 | Sulfridge |
| 2005/0164500 A1 | 7/2005 | Lindgren | | 2006/0290001 A1 | 12/2006 | Sulfridge |
| 2005/0184219 A1 | 8/2005 | Kirby | | 2006/0292877 A1 | 12/2006 | Lake |
| 2005/0189637 A1* | 9/2005 | Okayama et al. ............. 257/679 | | 2007/0004079 A1 | 1/2007 | Geefay et al. |
| 2005/0191861 A1 | 9/2005 | Verhaverbeke | | 2007/0012655 A1 | 1/2007 | Kwon et al. |
| 2005/0194169 A1 | 9/2005 | Tonomura | | 2007/0020805 A1 | 1/2007 | Kim et al. |
| 2005/0208766 A1 | 9/2005 | Kirby et al. | | 2007/0020935 A1 | 1/2007 | Taylor et al. |
| 2005/0227382 A1 | 10/2005 | Hui | | 2007/0023121 A1 | 2/2007 | Jones et al. |
| 2005/0231626 A1 | 10/2005 | Tuttle et al. | | 2007/0032061 A1 | 2/2007 | Farnworth et al. |
| 2005/0236708 A1 | 10/2005 | Farnworth et al. | | 2007/0035033 A1 | 2/2007 | Ozguz et al. |

| | | |
|---|---|---|
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0045858 A1 | 3/2007 | Kirby et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0122940 A1 | 5/2007 | Gautham |
| 2007/0126091 A1 | 6/2007 | Wood et al. |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0237881 A1 | 10/2008 | Dambrauskas et al. |
| 2008/0265933 A1 | 10/2008 | Tanioka et al. |
| 2008/0299759 A1 | 12/2008 | Chatterjee et al. |
| 2008/0299762 A1 | 12/2008 | Mathew et al. |
| 2008/0318361 A1 | 12/2008 | Han et al. |
| 2009/0007934 A1 | 1/2009 | Hutto |
| 2009/0014859 A1 | 1/2009 | Jeung et al. |
| 2009/0057912 A1 | 3/2009 | Kheng |
| 2009/0091962 A1 | 4/2009 | Chung et al. |
| 2009/0127668 A1 | 5/2009 | Choi |
| 2009/0146312 A1 | 6/2009 | Sulfridge |
| 2009/0166846 A1 | 7/2009 | Pratt et al. |
| 2009/0180257 A1 | 7/2009 | Park et al. |
| 2009/0224405 A1 | 9/2009 | Chiou et al. |
| 2009/0283898 A1 | 11/2009 | Janzen et al. |
| 2009/0305502 A1 | 12/2009 | Lee et al. |
| 2009/0315154 A1 | 12/2009 | Kirby et al. |
| 2009/0321947 A1 | 12/2009 | Pratt |
| 2010/0096759 A1 | 4/2010 | Kirby et al. |

FOREIGN PATENT DOCUMENTS

| | | |
|---|---|---|
| EP | 0127946 A1 | 12/1984 |
| EP | 0 886 323 | 12/1998 |
| EP | 1 157 9672 | 11/2001 |
| EP | 1154474 A1 | 11/2001 |
| EP | 1415950 A2 | 5/2004 |
| FR | 2 835 6541 | 8/2003 |
| JP | 59-101882 | 6/1984 |
| JP | 59-191388 | 10/1984 |
| JP | 63052432 A | 3/1988 |
| JP | 01252308 A | 10/1989 |
| JP | 02235589 A | 9/1990 |
| JP | 05104316 A | 4/1993 |
| JP | 07-263607 | 10/1995 |
| JP | 2001-077496 | 3/2001 |
| JP | 2001082931 A | 3/2001 |
| JP | 2001298147 A | 10/2001 |
| JP | 2002018585 A | 1/2002 |
| JP | 2005093980 A | 4/2005 |
| JP | 2005310817 A | 11/2005 |
| KR | 20010018694 | 3/2001 |
| KR | 20020022122 A | 3/2002 |
| KR | 20020061812 A | 7/2002 |
| TW | 250597 B | 3/2006 |
| WO | WO-90/054241 | 5/1990 |
| WO | WO-02/0758151 | 9/2002 |
| WO | WO-02/0957962 | 11/2002 |
| WO | WO-2004/0540012 | 6/2004 |
| WO | 2004109770 A2 | 12/2004 |
| WO | 2005022965 A2 | 3/2005 |
| WO | 2005036940 A1 | 4/2005 |
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.

com/downloads/M3D%20White%20Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.conn/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/htm/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.conn/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/ Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al., "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using MORIO High Density Plasmas," presented at the 197th Meeting of The Electrochemical Society, Toronto 2000, <http://www.trikon.com/pdfs/ECS2b.pdf>.

Trigas, C., "System-In-Package or System-On-Chip?," EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

\* cited by examiner

MICROFEATURE WORKPIECES AND METHODS FOR FORMING INTERCONNECTS IN MICROFEATURE WORKPIECES

CROSS-REFERENCE TO RELATED APPLICATION

This application is a divisional of U.S. patent application Ser. No. 11/218,243, filed Sep. 1, 2005, which is incorporated herein by reference in its entirety.

TECHNICAL FIELD

The present invention relates to methods for forming interconnects in microfeature workpieces and microfeature workpieces formed using such methods.

BACKGROUND

Microelectronic devices, micromechanical devices, and other devices with microfeatures are typically formed by constructing several layers of components on a workpiece. In the case of microelectronic devices, a plurality of dies are fabricated on a single workpiece, and each die generally includes an integrated circuit and a plurality of bond-pads coupled to the integrated circuit. The dies are separated from each other and packaged to form individual microelectronic devices that can be attached to modules or installed in other products.

One aspect of fabricating and packaging such dies is forming interconnects that electrically couple conductive components located in different layers. In some applications, it may be desirable to form interconnects that extend completely through the dies or through a significant portion of the dies. Such interconnects electrically couple bond-pads or other conductive elements proximate to one side of the dies to conductive elements proximate to the other side of the dies. Through-wafer interconnects, for example, are constructed by forming deep vias on the front side and/or backside of the workpiece and in alignment with corresponding bond-pads at the front side of the workpiece. The vias are often blind vias in that they are closed at one end. The blind vias are then filled with a conductive fill material. After further processing, the workpiece is thinned to reduce the thickness of the final dies. Solder balls or other external electrical contacts are subsequently attached to the through-wafer interconnects at the backside and/or the front side of the workpiece. The solder balls or external contacts can be attached either before or after singulating the dies from the workpiece.

One concern of forming through-wafer interconnects is that conventional processes are susceptible to shorting. For example, FIGS. 1A-1C illustrate a conventional process of forming a through-wafer interconnect. FIG. 1A is a schematic side cross-sectional view of a workpiece 100 including a substrate 112, a terminal 122 on the substrate 112, and a hole 145 extending through the terminal 122 and into the substrate 112. After forming the hole 145, a dielectric layer 134 is deposited across the workpiece 100 and into the hole 145 to insulate the substrate 112 from the conductive material of the interconnect. FIG. 1B illustrates the workpiece 100 after removing a portion of the dielectric layer 134 with a spacer etching process. This process sometimes exposes a section 115 of an upper surface 114 on the substrate 112. FIG. 1C illustrates the workpiece 100 after forming a conductive interconnect 182 in the hole 145 with the interconnect 182 contacting the terminal 122. If the substrate 112 includes an exposed section 115, the interconnect 182 may also contact the substrate 112 and create a short between the terminal 122 and the substrate 112. Therefore, there is a need to improve the process of forming interconnects in workpieces.

DETAILED DESCRIPTION

A. Overview

Figure 1A:
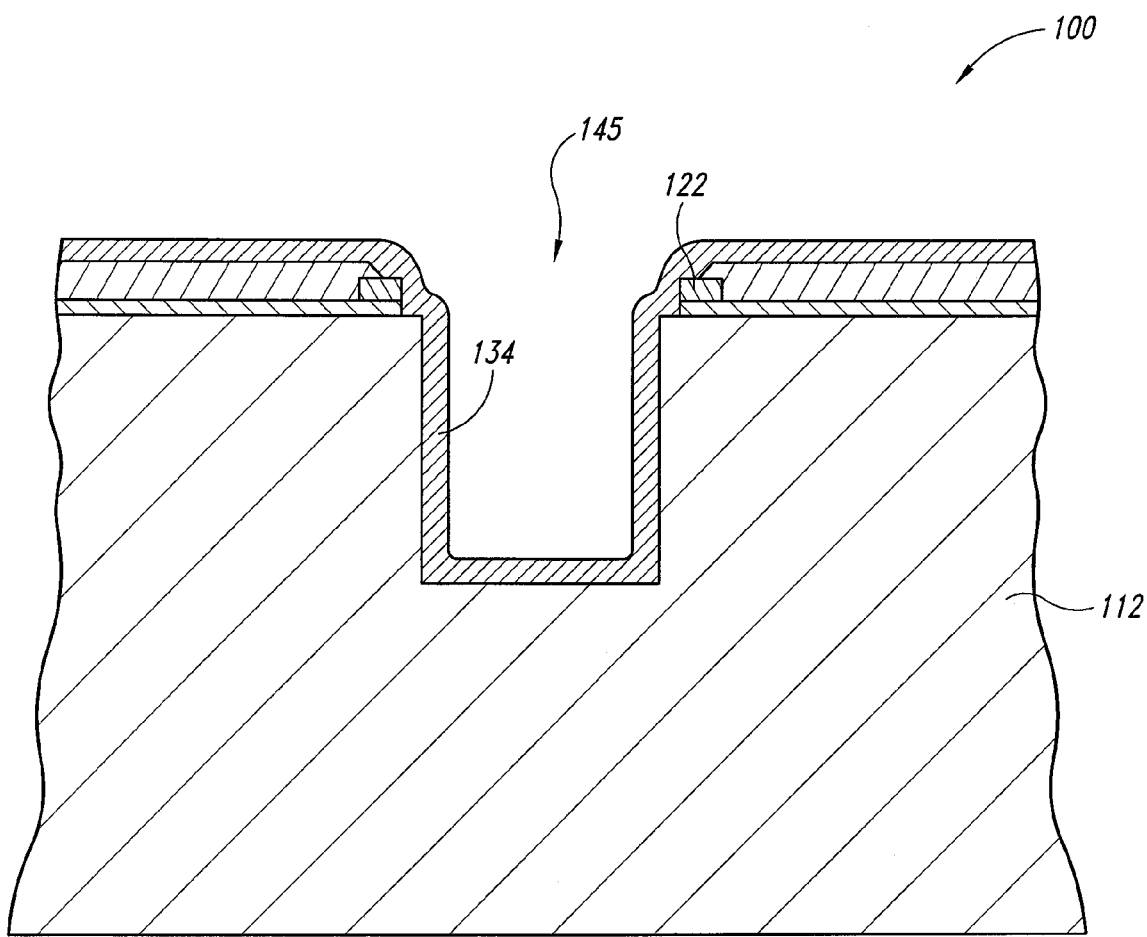
FIGS. 1A-1C illustrate a conventional process of forming an electrically conductive interconnect in accordance with the prior art.
Figure 1B:
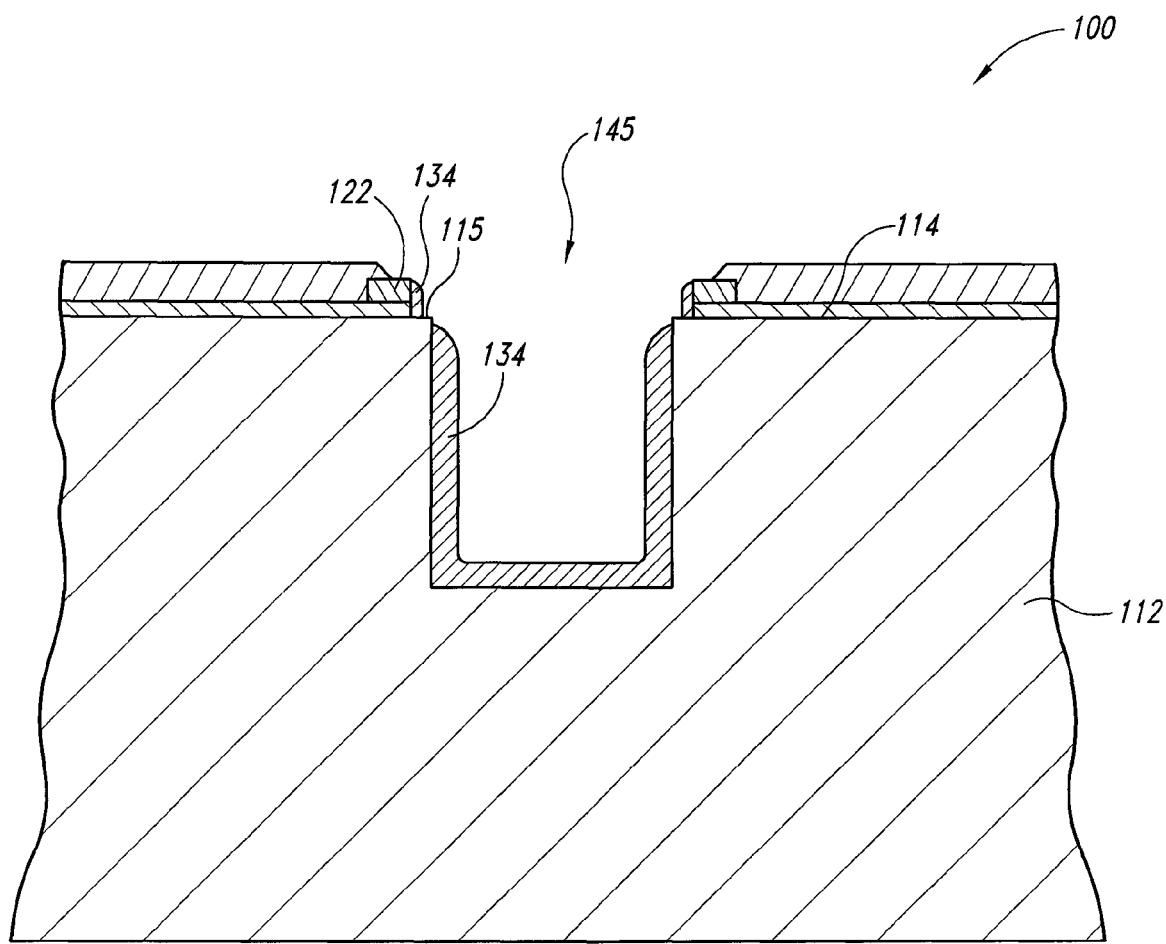
Figure 1C:
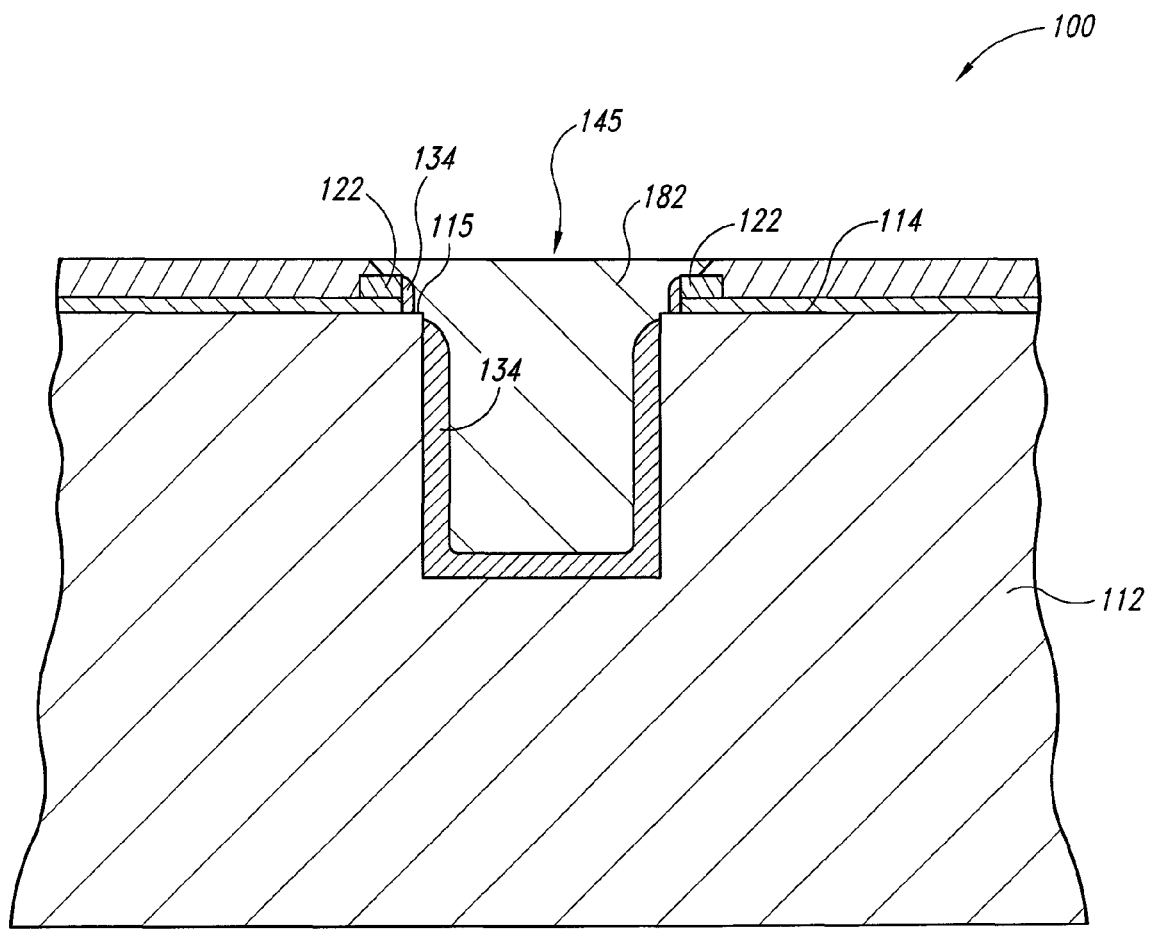

The following disclosure describes several embodiments of methods for forming interconnects in microfeature workpieces, and microfeature workpieces having such interconnects. One aspect of the invention is directed to methods of forming an interconnect in a microfeature workpiece having a substrate, a terminal, and a dielectric layer between the substrate and the terminal. An embodiment of one such method includes forming a hole extending through the terminal and the dielectric layer to at least an intermediate depth in the substrate. The hole has a first lateral dimension in the dielectric layer and a second lateral dimension in the substrate proximate to an interface between the dielectric layer and the substrate. The second lateral dimension is greater than the first lateral dimension. The method further includes constructing an electrically conductive interconnect in at least a portion of the hole and in electrical contact with the terminal.

The hole can be formed by etching the substrate in a first cycle for a first time period to form a first section of the hole in the substrate, and etching the substrate in a second cycle for a second time period to form a second section of the hole in the substrate. The second time period is less than the first time period. Moreover, the hole can be formed by (a) selectively removing a portion of the dielectric layer and a first portion of the substrate with a first process, and (b) selectively removing a second portion of the substrate with a second process. In either case, the hole can be constructed such that the dielectric layer overhangs a section of the hole in the substrate at the interface between the dielectric layer and the substrate. As such, the workpiece includes an undercut in the substrate at the interface between the dielectric layer and the substrate.

In another embodiment, a method includes (a) providing a microfeature workpiece having a substrate, a dielectric layer on the substrate, and a terminal on the dielectric layer, (b) forming a hole in the terminal of the workpiece, and (c) removing a portion of the dielectric layer and a portion of the substrate in a single, generally continuous process. The portion of the dielectric layer and the portion of the substrate are generally aligned with the hole in the terminal and can be removed by etching or other suitable processes.

Another aspect of the invention is directed to microfeature workpieces. In one embodiment, a microfeature workpiece includes a substrate, a dielectric layer on the substrate, a terminal on the dielectric layer, an operable microelectronic feature carried by the substrate and operably coupled to the terminal, and an interconnect via extending through the terminal and the dielectric layer to at least an intermediate depth in the substrate. The interconnect via includes an undercut portion in the substrate at an interface between the dielectric layer and the substrate. The interconnect via can have a first lateral dimension in the dielectric layer and a second lateral dimension in the substrate at an interface between the dielectric layer and the substrate. The second lateral dimension is greater than the first lateral dimension. The microfeature workpiece can further include an electrically conductive interconnect in the interconnect via and in contact with the terminal.

Specific details of several embodiments of the invention are described below with reference to interconnects extending from a terminal proximate to the front side of a workpiece, but the methods and interconnects described below can be used for other types of interconnects within microelectronic workpieces. Several details describing well-known structures or processes often associated with fabricating microelectronic devices are not set forth in the following description for purposes of clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2A-3G. The term "microfeature workpiece" is used throughout to include substrates upon which and/or in Which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Forming Interconnects in Microfeature Workpieces

Figure 2A:
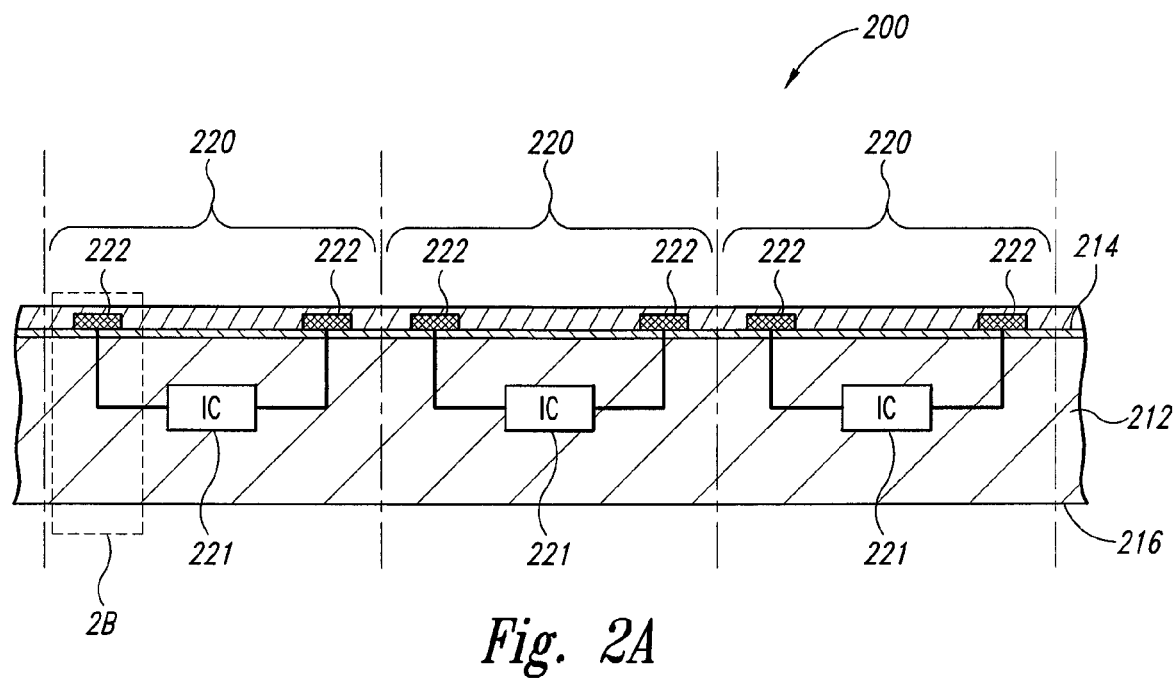
FIGS. 2A-2Q are side cross-sectional views illustrating stages of a method for forming electrically conductive interconnects in a microfeature workpiece in accordance with an embodiment of the invention.
Figure 2B:
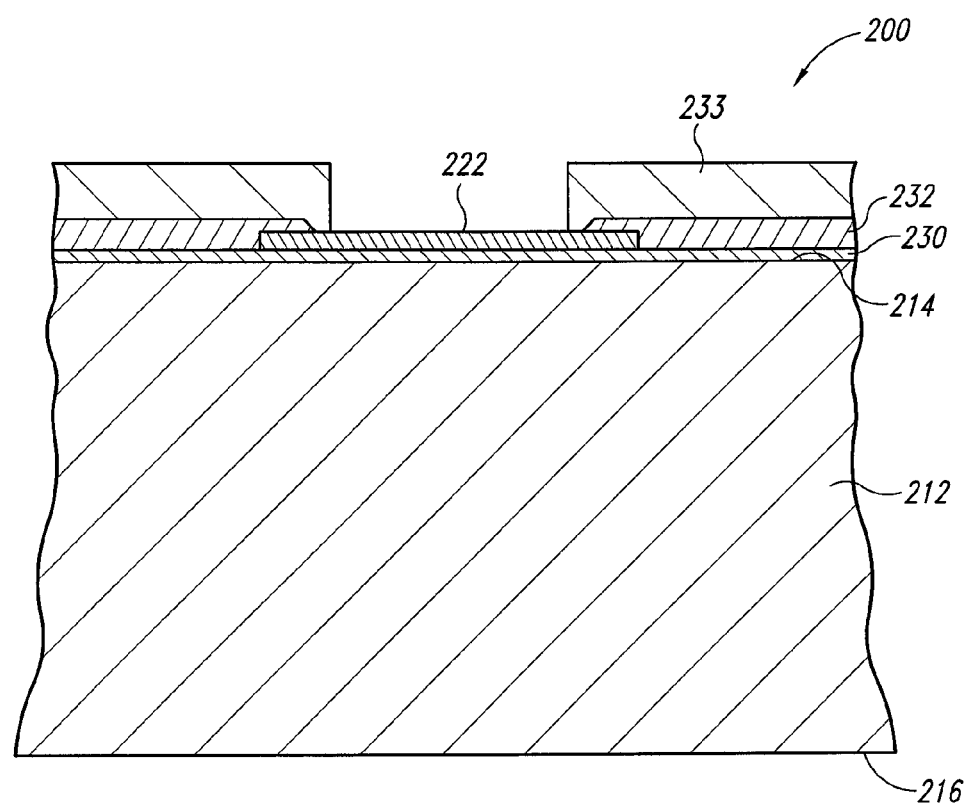
Figure 2C:
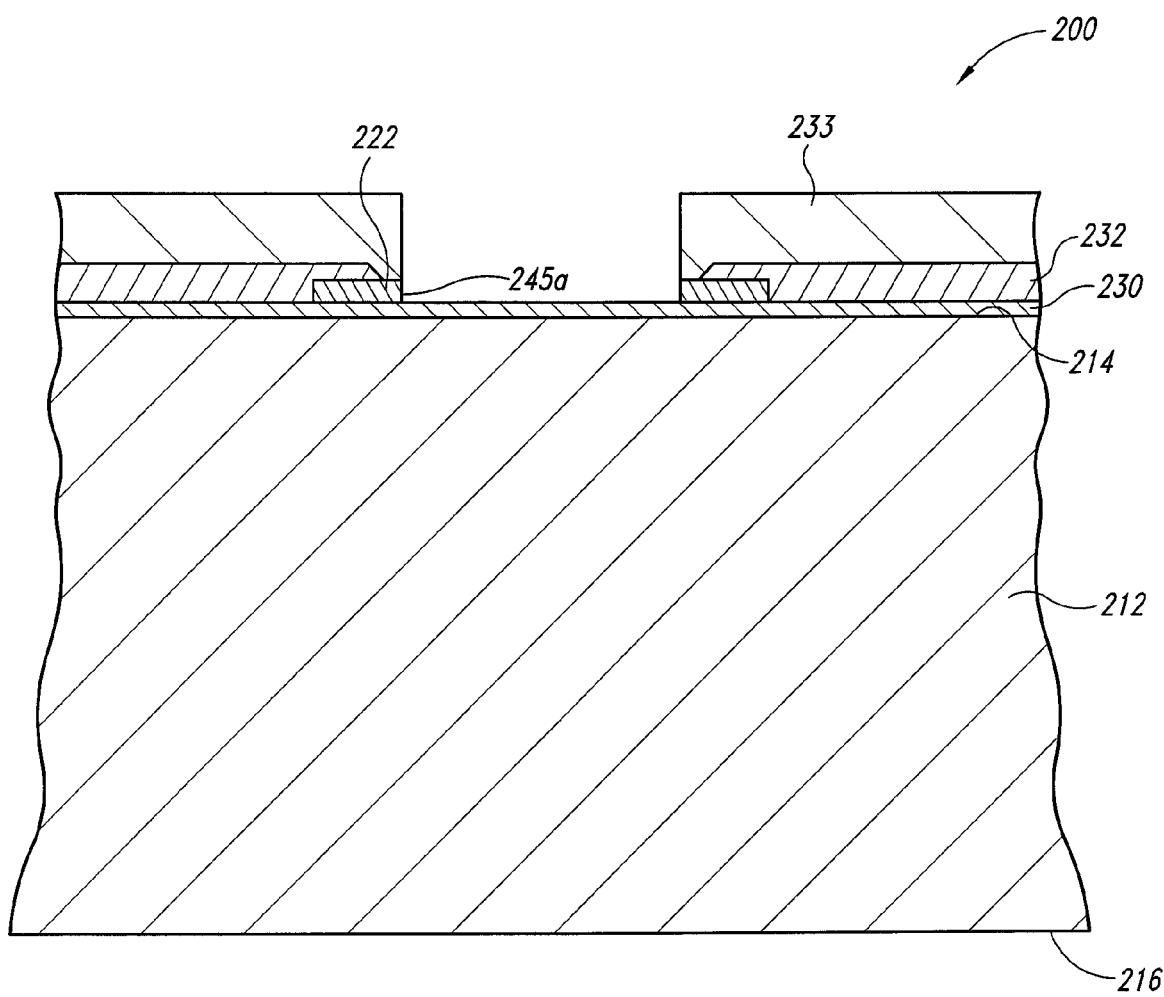
Figure 2D:
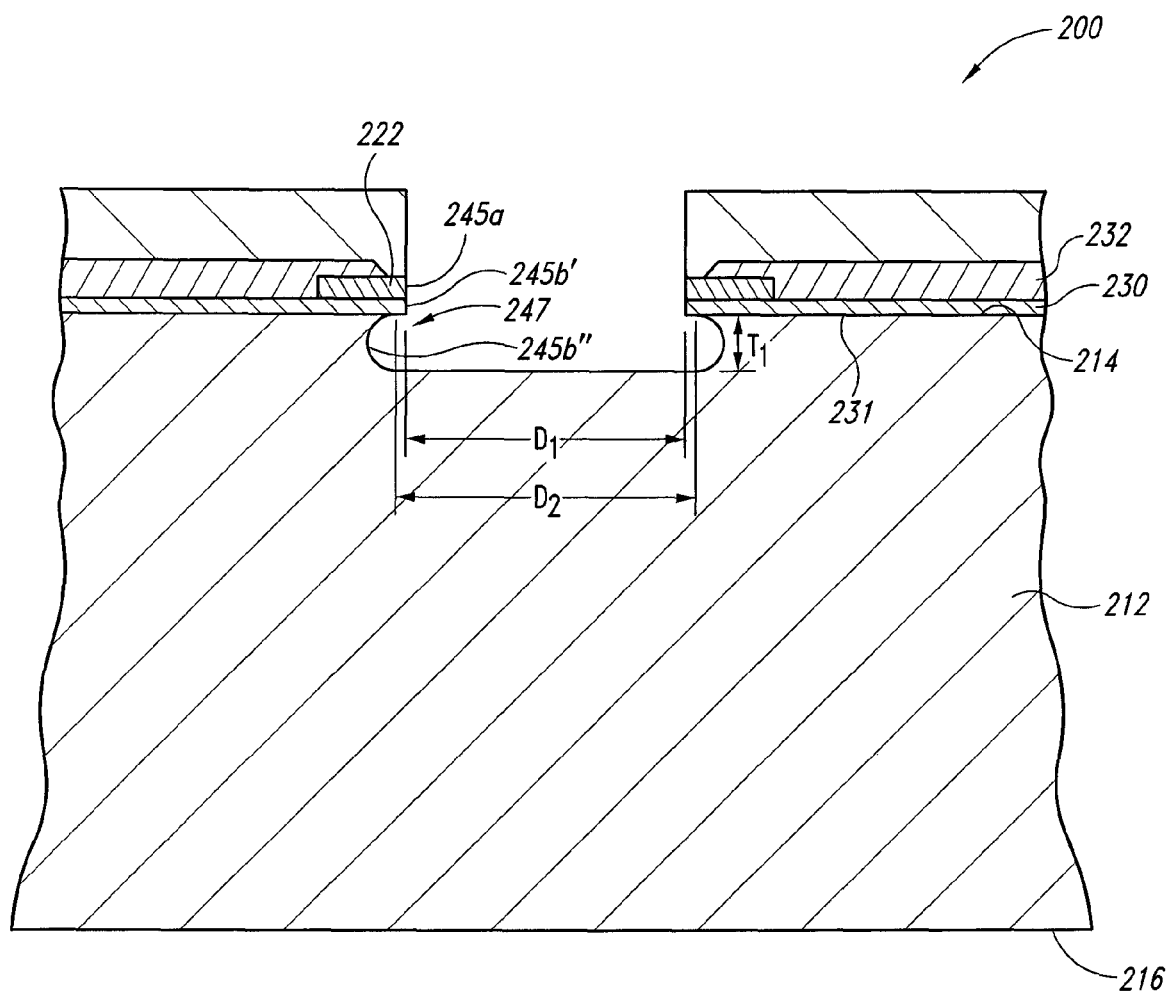
Figure 2E:
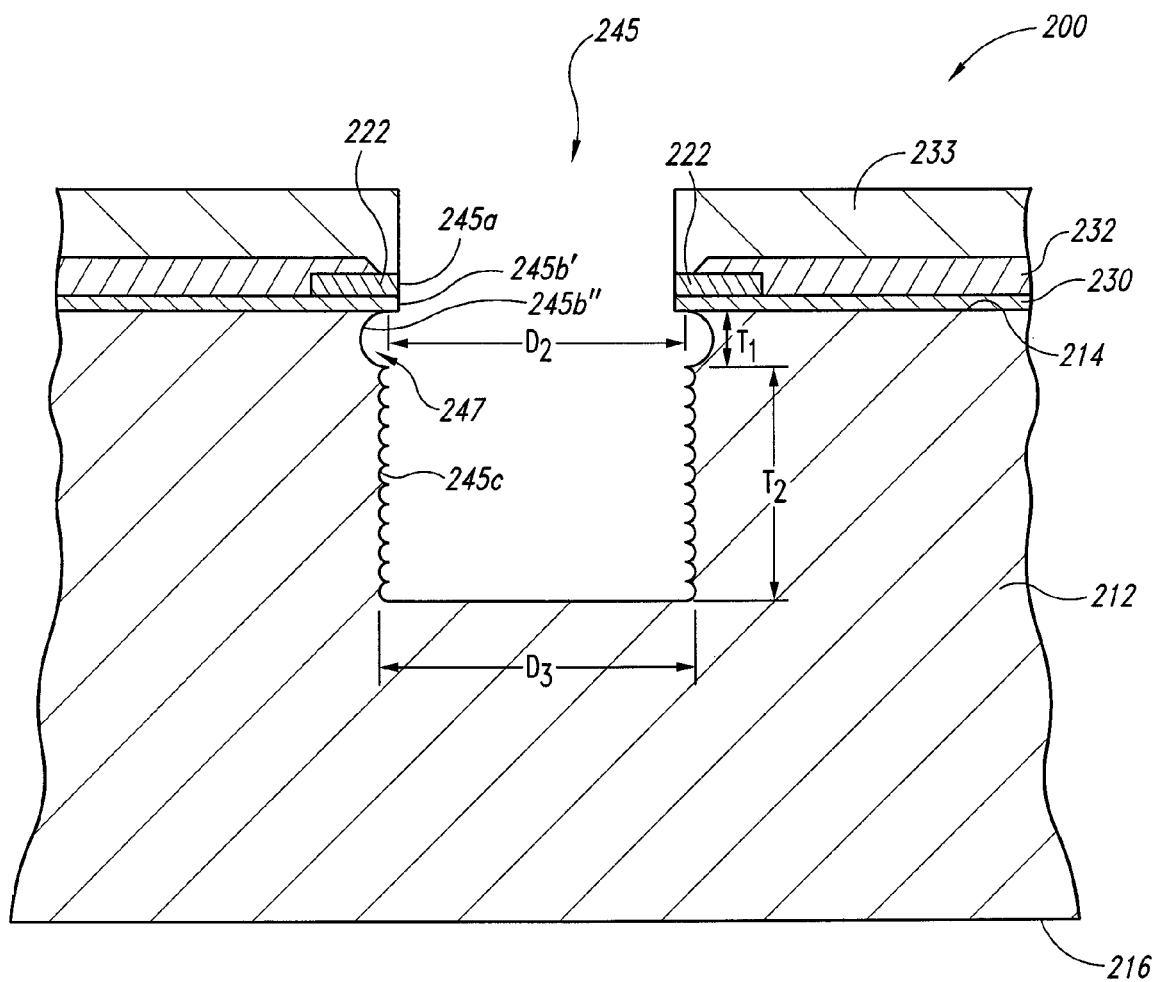
Figure 2F:
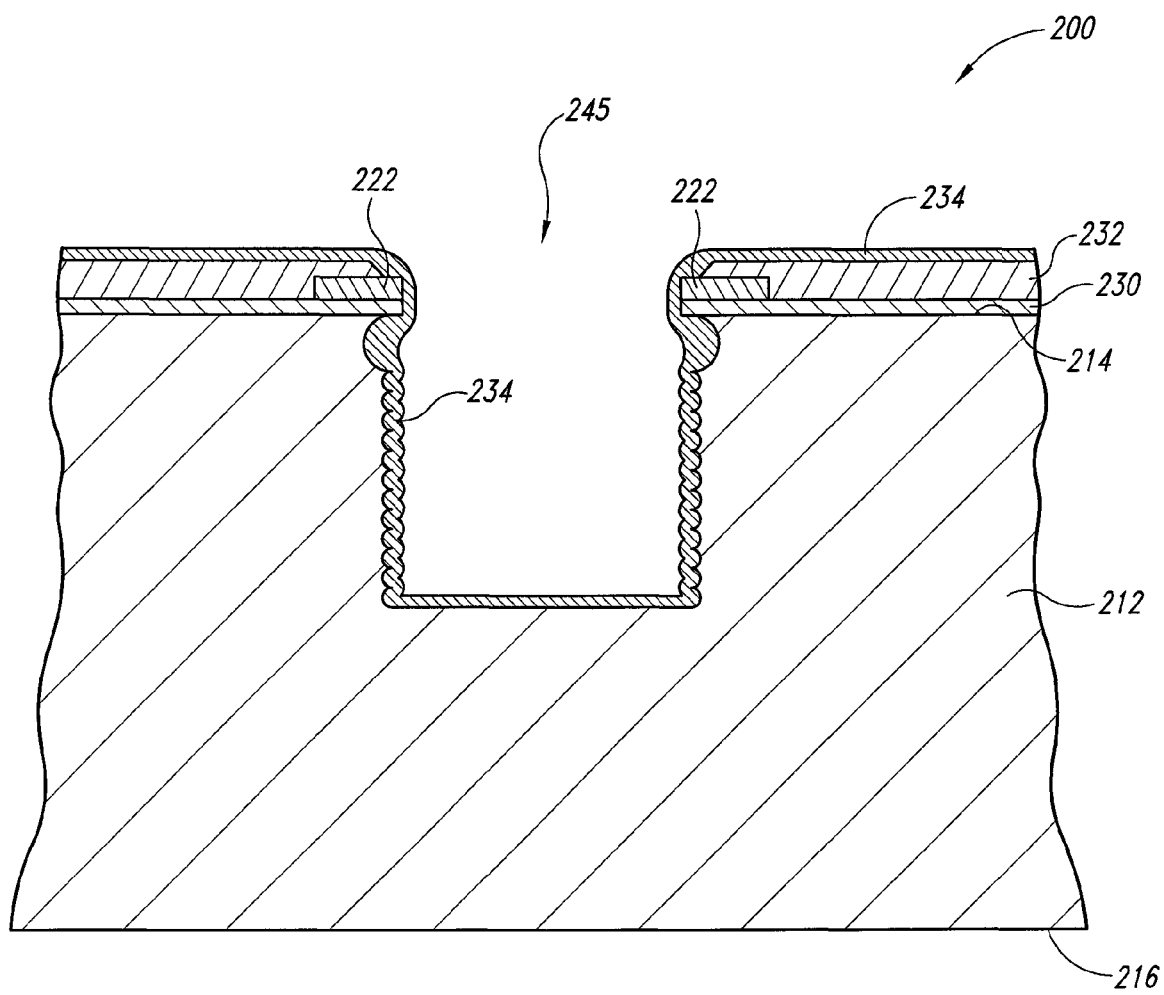
Figure 2G:
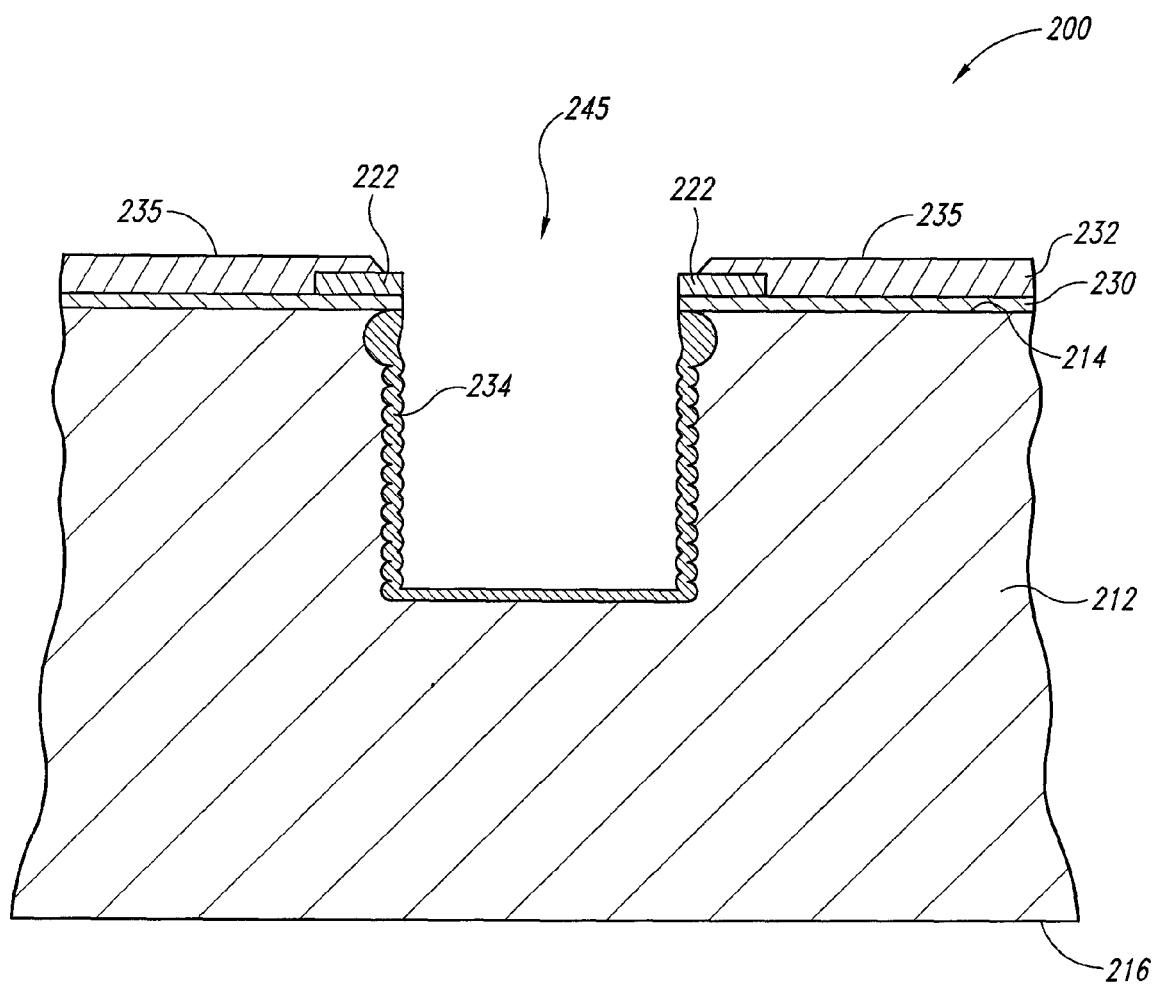
Figure 2H:
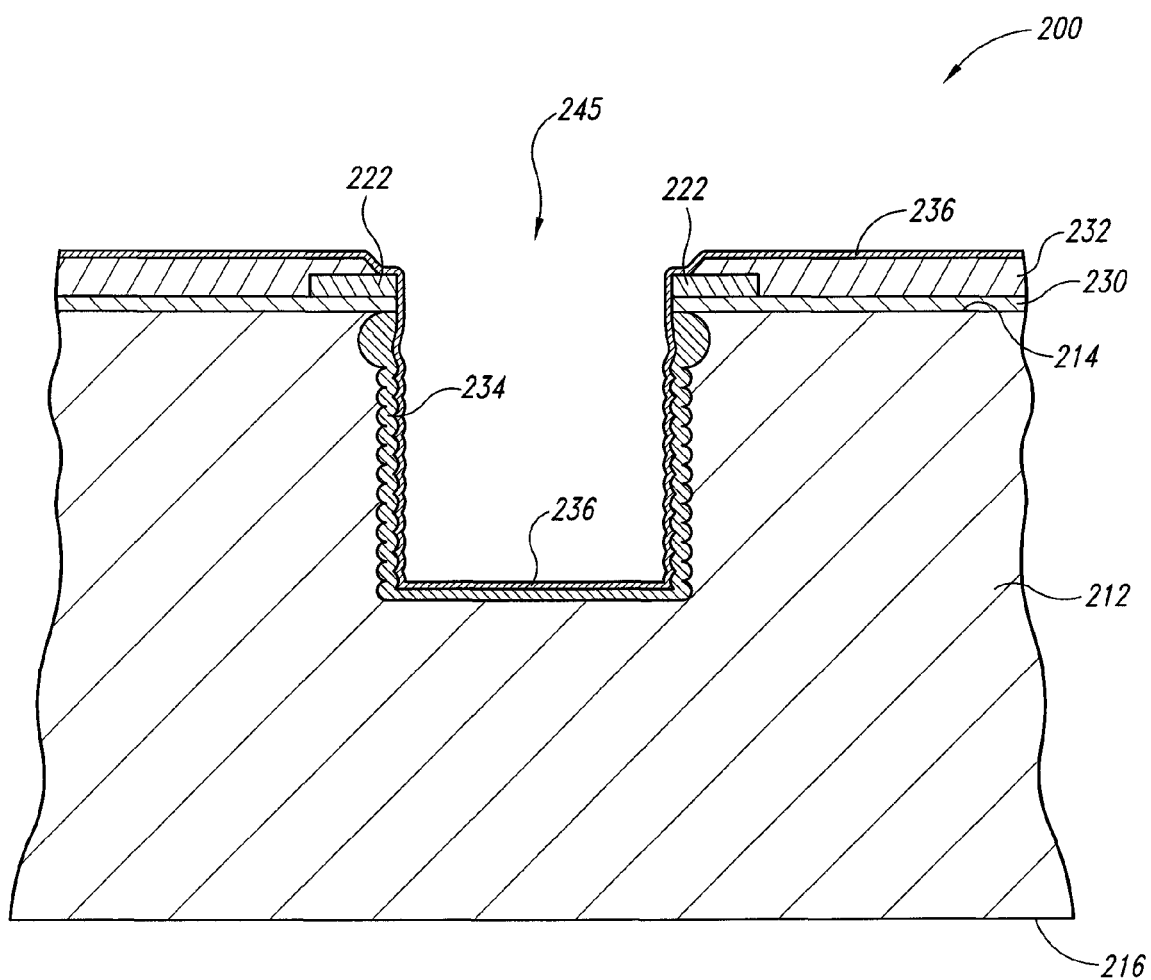
Figure 2I:
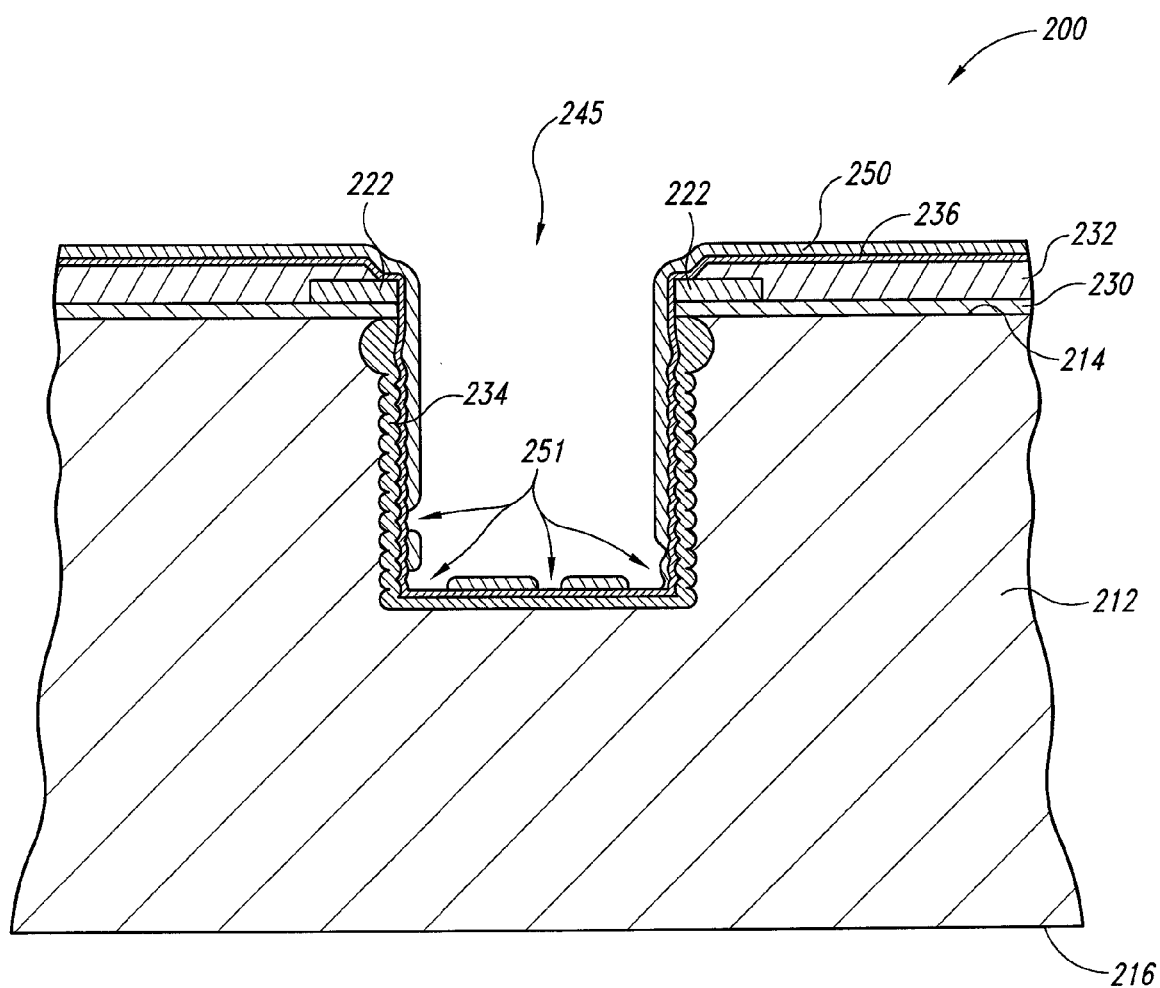
Figure 2J:
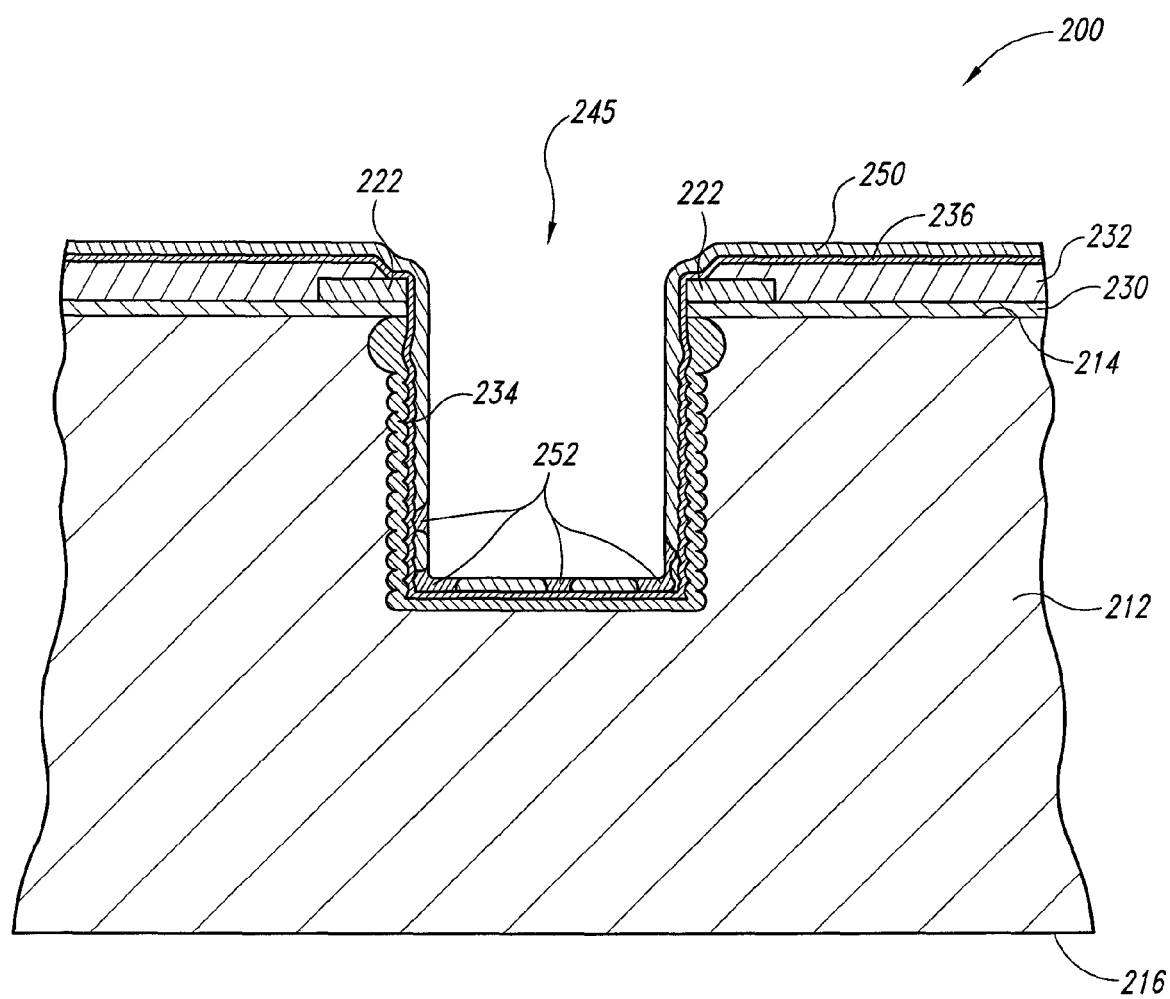
Figure 2K:
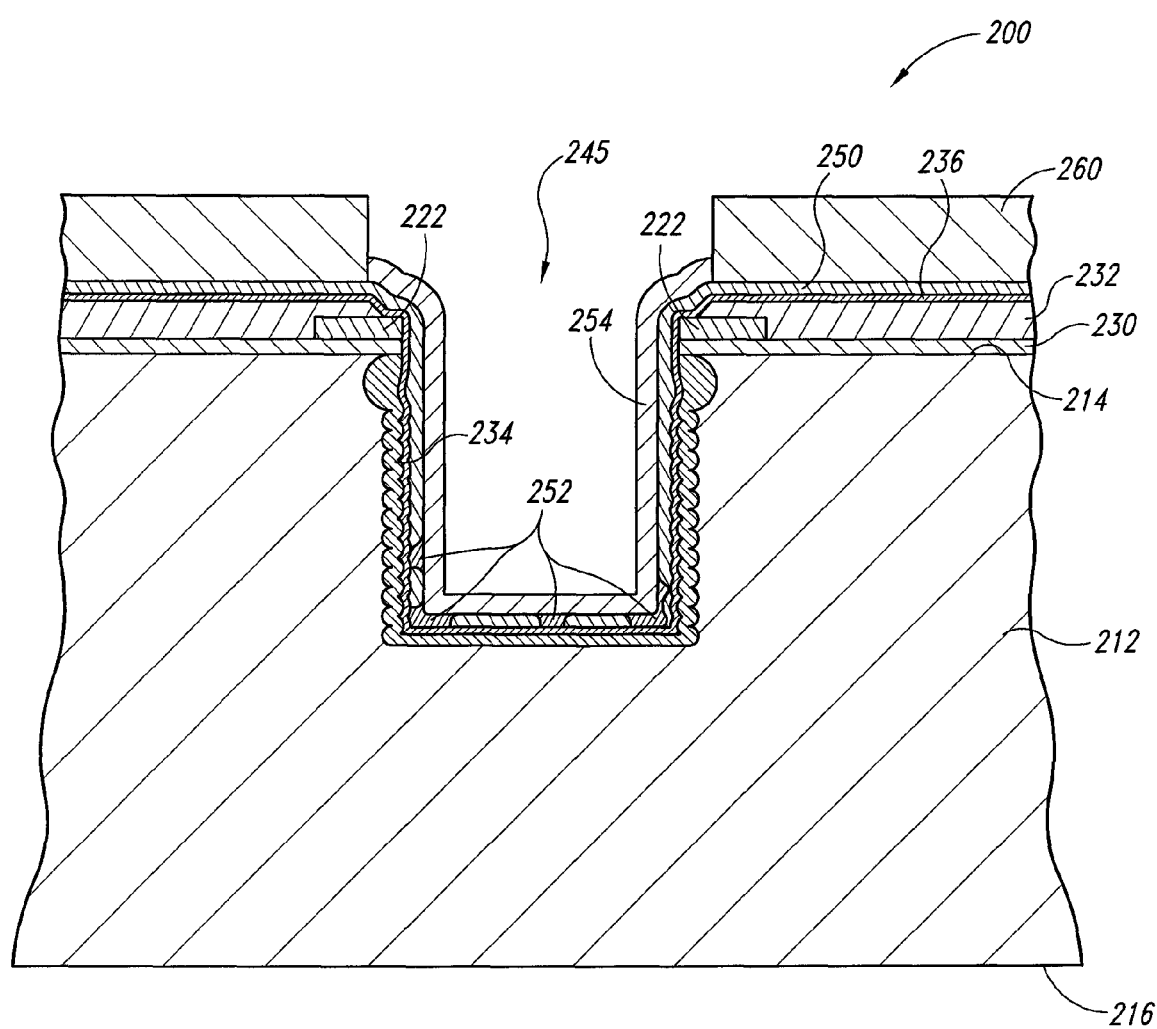
Figure 2L:
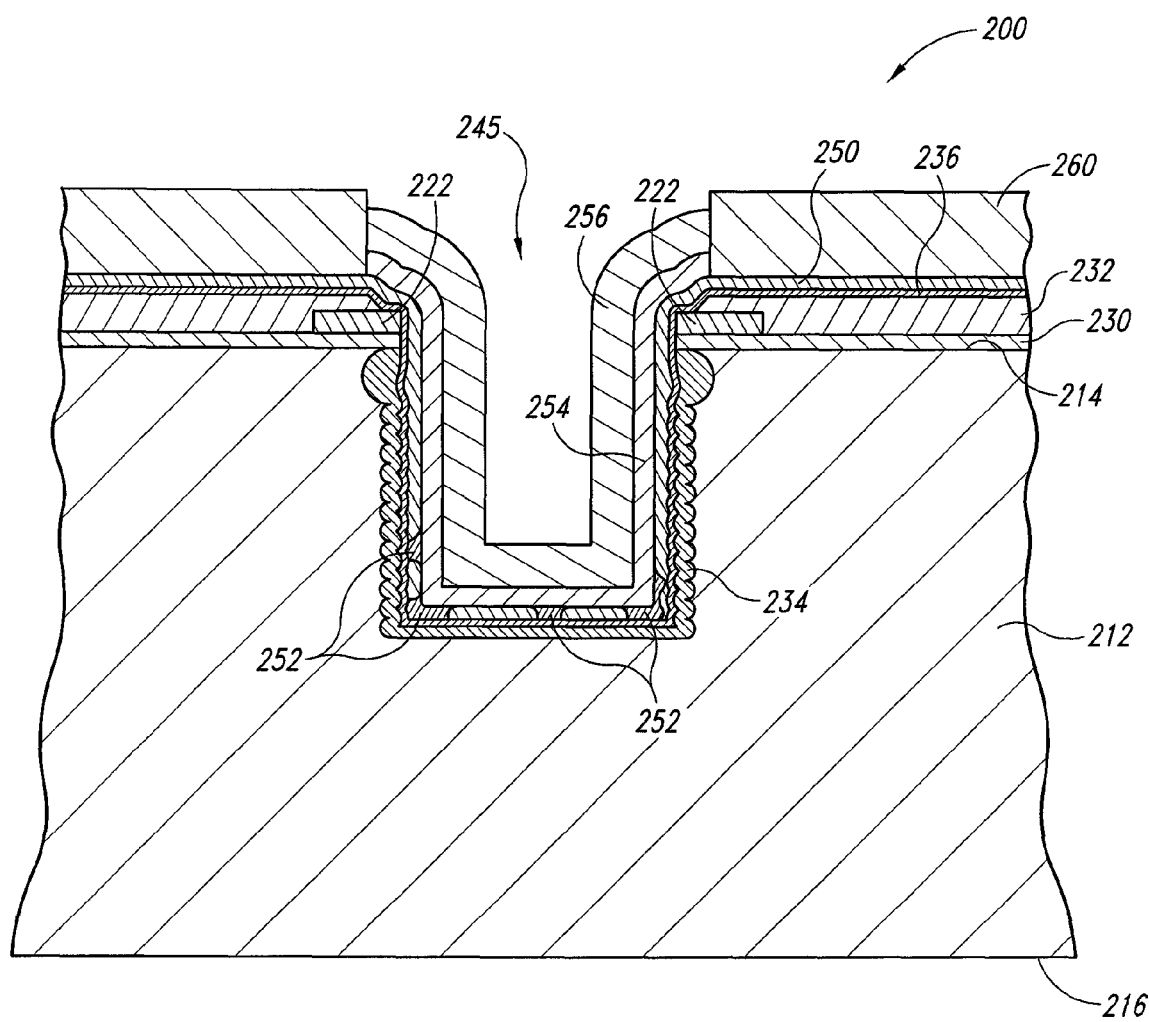
Figure 2M:
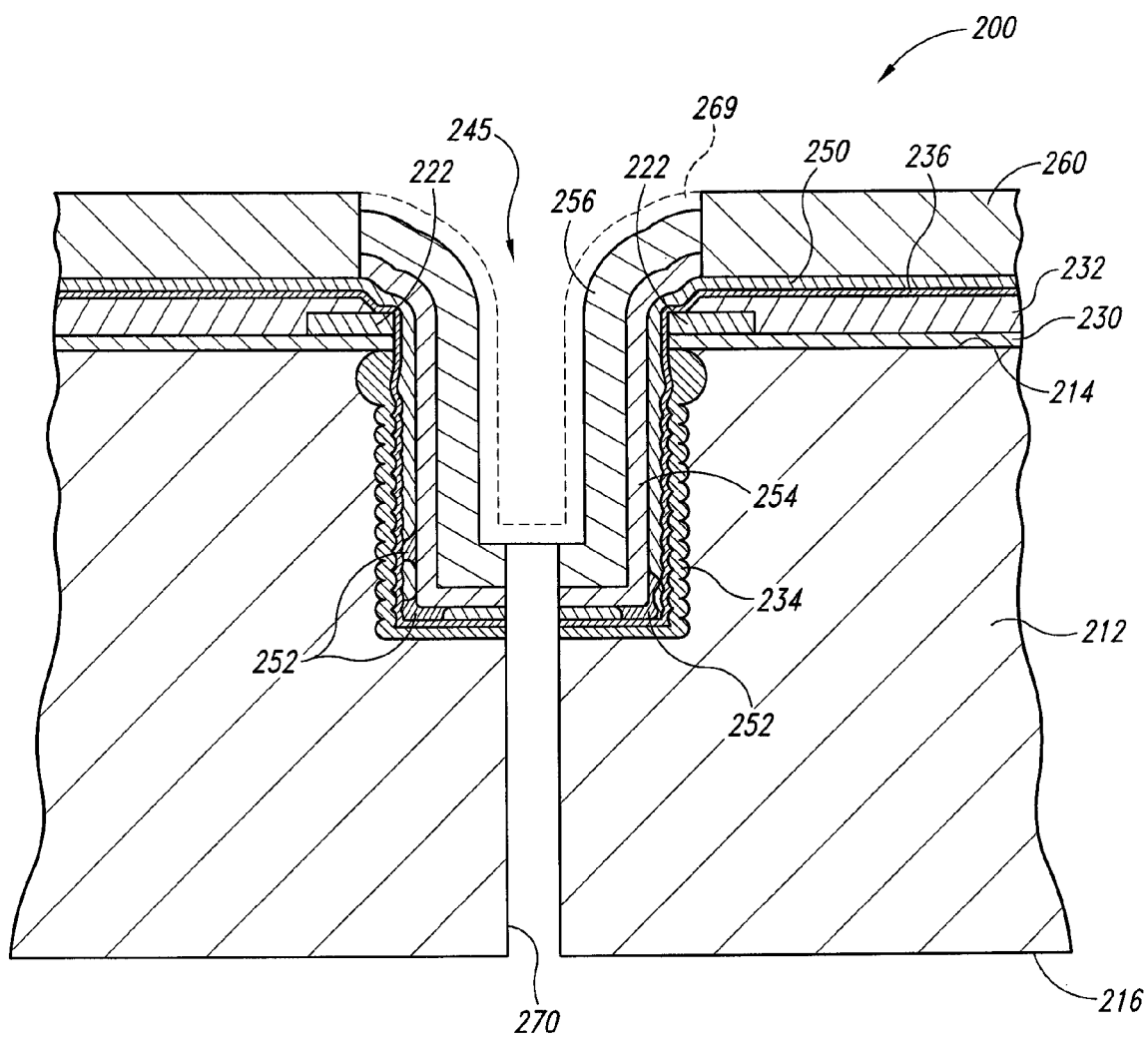
Figure 2N:
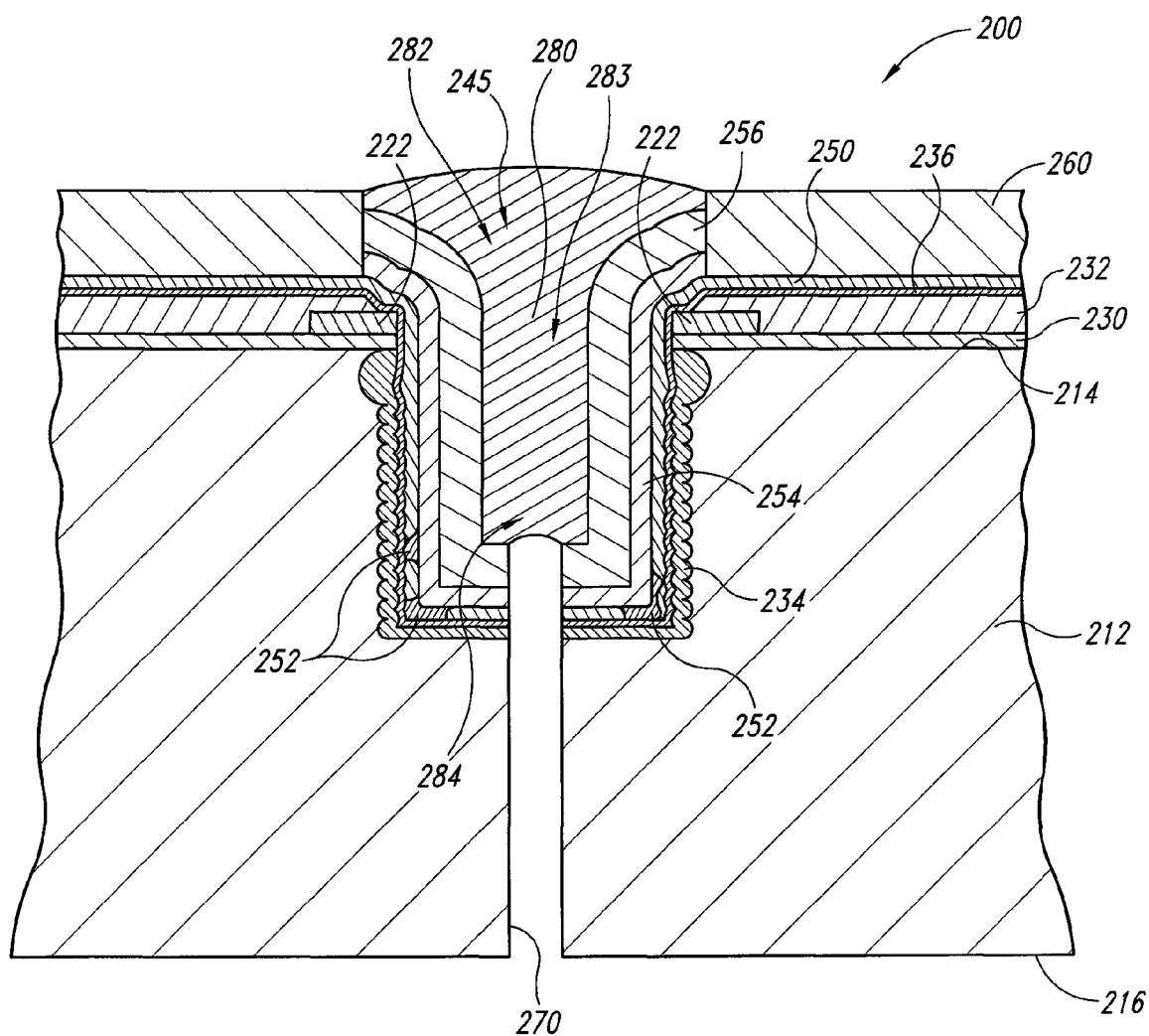
Figure 20:
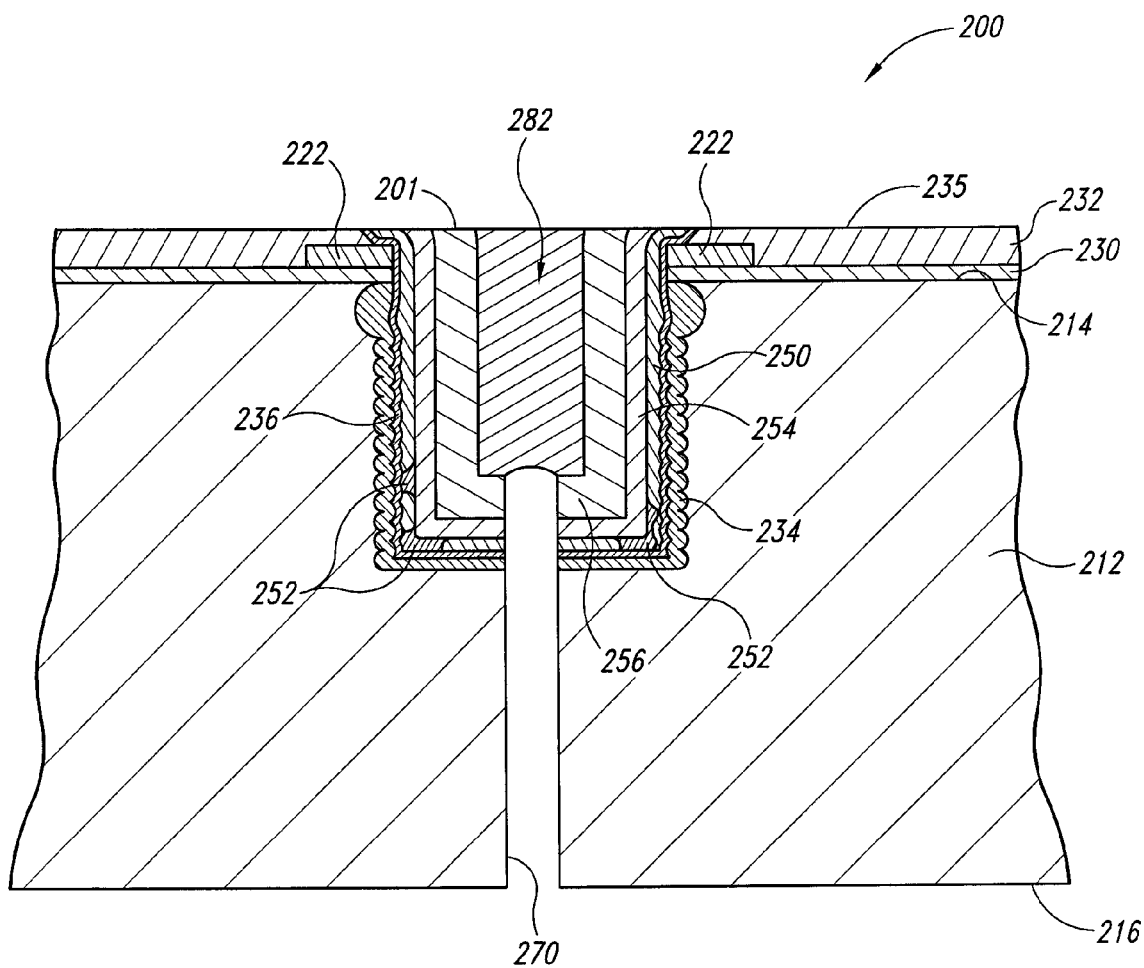
Figure 2P:
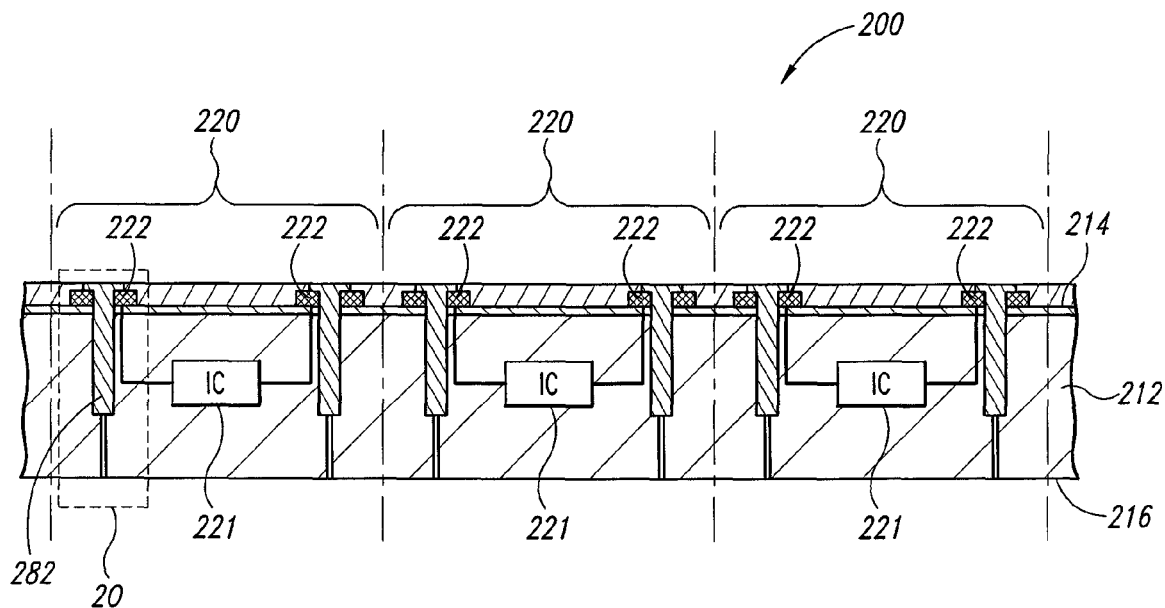
Figure 2Q:
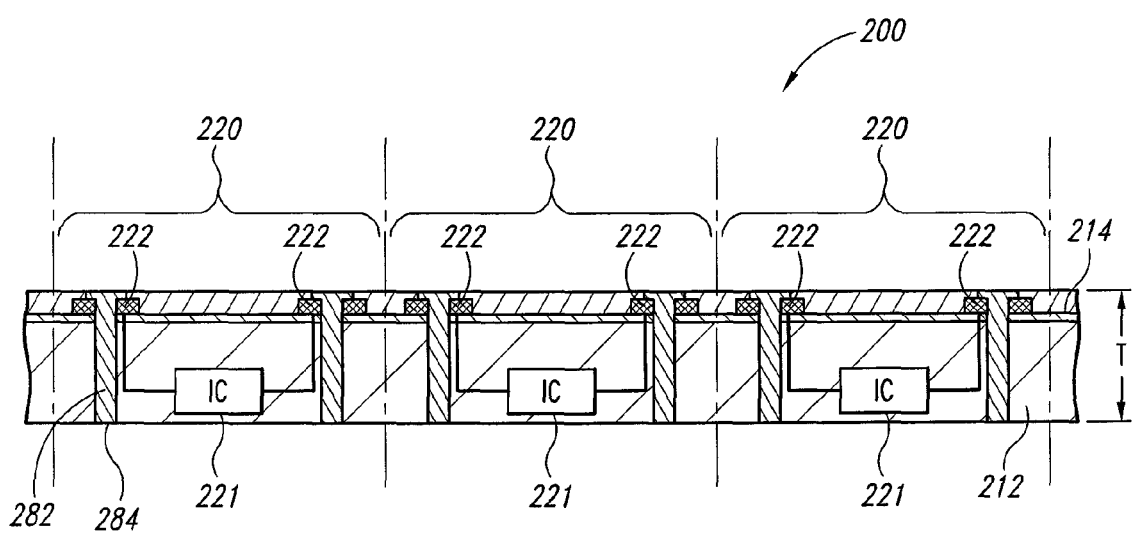

FIGS. 2A-2Q illustrate stages of a method for forming interconnects in a microfeature workpiece 200 in accordance with an embodiment of the invention. FIG. 2A, for example, is a side cross-sectional view of a portion of the workpiece 200 at an initial stage before the interconnects have been formed. The workpiece 200 can include a substrate 212 and a plurality of microelectronic dies 220 formed in and/or on the substrate 212. The substrate 212 has a first side 214 and a second side 216 opposite the first side 214. The substrate 212 is generally a semiconductor wafer, and the dies 220 are arranged in a die pattern on the wafer. The individual dies 220 include integrated circuitry 221 (shown schematically) and a plurality of terminals 222 (e.g., bond-pads) electrically coupled to the integrated circuitry 221. The terminals 222 shown in FIG. 2A are external features at the first side 214 of the substrate 212. In other embodiments, however, the terminals 222 can be internal features that are embedded at an intermediate depth within the substrate 212.

FIG. 2B is a side cross-sectional view of the area 2B shown in FIG. 2A. In previous processing steps, a first dielectric layer 230 was applied to the first side 214 of the substrate 212, and a second dielectric layer 232 was applied over the first dielectric layer 230. The second dielectric layer 232 was then patterned and etched to expose the terminal 222. The dielectric layers 230 and 232 can be a polyimide material or other suitable nonconductive materials. For example, the dielectric layers 230 and 232 can be parylene, a low temperature chemical vapor deposition (low temperature CVD) material such as silicon nitride ($Si_3N_4$), silicon oxide ($SiO_2$), and/or other suitable materials. The foregoing list of dielectric materials is not exhaustive. The dielectric layers 230 and 232 are generally not composed of the same material as each other, but these layers may be composed of the same material. In addition, one or both of the layers 230 and 232 may be omitted and/or additional layers may be included. After depositing the second dielectric layer 232, a mask 233 is applied over the second dielectric layer 232 and patterned as shown in FIG. 2B. The mask 233 can be a layer of resist that is patterned according to the arrangement of terminals 222 on the workpiece 200. As such, the mask 233 has an opening over the terminal 222.

Referring to FIG. 2C, a first hole section 245a has been formed through the terminal 222. The first hole section 245a can be formed using a wet etching or dry etching process that selectively removes material from the terminal 222 and generally does not remove material from the first dielectric layer 230. The first dielectric layer 230 can accordingly be an etch-stop. In embodiments in which the terminal 222 includes more than one type of metal, the etching process can be repeated until the first hole section 245a extends through the terminal 222.

Referring to FIG. 2D, a second hole section 245b (identified as 245' and 245b") has been formed in the first dielectric layer 230 and the substrate 212. The second hole section 245b has a first portion 245b' that extends through the first dielectric layer 230 and a second portion 245b" that extends from the interface of the substrate 212 and the first dielectric layer 230 to a first depth $T_1$ in the substrate 212. The first portion 245b' has a first diameter $D_1$ and is generally aligned with the first hole section 245a in the terminal 222. The second portion 245b" has a second diameter $D_2$ at the interface of the substrate 212 and the first dielectric layer 230. The second diameter $D_2$ is greater than the first diameter $D_1$ such that the second portion 245b" forms an undercut portion 247 in the substrate 212 below the first dielectric layer 230 and exposes a portion of a back surface 231 of the first dielectric layer 230. As a result, the first dielectric layer 230 forms an overhang over the second portion 245b".

In the illustrated method, the second hole section 245b is formed in a single, generally continuous process. For example, the second hole section 245b can be formed in a single dry oxide etch process that, due to the nature of the etchant, tends to anisotropically etch the first dielectric layer 230 and isotropically etch the substrate 212. The second etching process for the first dielectric layer 230 and the upper portion of the substrate 212 can be different than the first etching process for the terminal 222. For example, the second etching process can selectively remove material from the first dielectric layer 230 and the substrate 212 at a higher etch rate than from the terminal 222. The second etching process accordingly does not significantly alter the general structure of the terminal 222. In an alternative embodiment, the first and second hole sections 245a-b can be formed using a single etching process.

Table 1 below illustrates one example of a recipe for a suitable second etching process to remove material from the first dielectric layer 230 and the upper portion of the substrate 212.

TABLE 1

| Step 1 | |
| --- | --- |
| Step end control | BY TIME |
| Maximum step time | 7 seconds |
| Pressure | SERVO 200 MTORR |
| RF power, match, mode | 0 W, AUTO, RF OFF |
| Helium Pressure | 9000 |
| AR | 50 sccm |
| CF4 | 50 sccm |
| CHF3 | 25 sccm |
| NF3 | 45 sccm |
| Step 2 | |
| Step end control | BY TIME |
| Maximum step time | 20 seconds |
| Pressure | SERVO 200 MTORR |
| RF power, match, mode | 1050 W, AUTO, B-to-B |
| Helium Pressure | 9000 |
| AR | 50 sccm |
| CF4 | 50 sccm |
| CHF3 | 20 sccm |
| NF3 | 45 sccm |
| Step 3 | |
| Step end control | BY TIME |
| Maximum step time | 330 seconds |
| Pressure | SERVO 200 MTORR |
| RF power, match, mode | 1050 W, AUTO, RF OFF |
| Helium Pressure | 9000 |
| AR | 50 sccm |
| CF4 | 70 sccm |
| CHF3 | 20 sccm |
| NF3 | 20 sccm |

Referring to FIG. 2E, a third hole section 245c has been formed in the substrate 212. The third hole section 245c has a third diameter $D_3$ that can be greater than, less than, or equal to the second diameter $D_2$. The third diameter $D_3$ of the third hole section 245c is generally a function of the available real estate and processing parameters for subsequent stages. The third hole section 245c extends a second depth $T_2$ into the substrate 212 that is greater than the first depth $T_1$. Although the illustrated first, second, and third hole sections 245a-c define a blind hole 245 that extends through only a portion of the workpiece 200 and is closed at one end, in other embodiments the hole 245 can be through hole that extends completely through the workpiece 200.

The illustrated third hole section 245c is formed by etching the substrate 212 using one or more individual etches, such as a deep silicon etch. After forming the third hole section 245c, the mask 233 is removed from the workpiece 200. The third hole section 245c can alternatively be formed using laser ablation in addition to or in lieu of etching. If a laser is used to form all or a portion of the third hole section 245c, the hole 245 is typically cleaned using chemical cleaning agents to remove slag and/or other contaminants. Etching the entire hole 245 may be easier than laser cutting because the slag does not need to be cleaned from the hole 245 and, in applications in which the hole 245 is a blind hole, the depth of the hole 245 can be more precisely controlled with an etching process. Moreover, blind holes can generally be more precisely aligned using an etching process than a laser cutting process. A further advantage of using an etching process is that the first side 214 of the substrate 212 can be patterned and etched to simultaneously form a plurality of holes 245 aligned with corresponding terminals 222.

Referring next to FIG. 2F, a third dielectric layer 234 is deposited onto the workpiece 200 to line the sidewalls of the hole 245 in the substrate 212. The third dielectric layer 234 electrically insulates components in the substrate 212 from an interconnect that is subsequently formed in the hole 245. In one embodiment, the third dielectric layer 234 can be an ALD (atomic layer deposition) aluminum oxide material applied using a suitable deposition process or another suitable low temperature CVD oxide. In another embodiment, the third dielectric layer 234 can include a silane-based and/or an aluminum-based oxide material. In still further embodiments, the third dielectric layer 234 can include other suitable dielectric materials. Referring to FIG. 2G, a suitable etching process (e.g., a spacer etch) is used to remove the third dielectric layer 234 from at least a portion of the terminal 222 and a first surface 235 of the second dielectric layer 232.

Referring to FIG. 2H, a diffusion barrier layer 236 is then deposited onto the workpiece 200 over the third dielectric layer 234 in the hole 245 and is in electrical contact with the terminal 222. The barrier layer 236 generally covers the second dielectric layer 232 and the terminal 222 in addition to the third dielectric layer 234. In one embodiment, for example, the barrier layer 236 is a layer of tantalum that is deposited onto the workpiece 200 using physical vapor deposition (PVD). The thickness of the barrier layer 236 is about 150 Angstroms. In other embodiments, the barrier layer 236 may be deposited onto the workpiece 200 using other vapor deposition processes, such as CVD, and/or may have a different thickness. The barrier layer 236 is not limited to tantalum, but rather may be composed of tungsten or other suitable materials that help contain the fill material subsequently deposited into the hole 245.

Referring next to FIG. 2I, a seed layer 250 is deposited onto the barrier layer 236. The seed layer 250 can be deposited using vapor deposition techniques, such as PVD, CVD, atomic layer deposition, and/or plating. The seed layer 250 can be composed of Cu or other suitable materials. The thickness of the seed layer 250 may be about 2000 Angstroms, but could be more or less depending upon the depth and aspect ratio of the hole 245. In several embodiments, the seed layer 250 may not uniformly cover the barrier layer 236 such that the seed layer 250 has voids 251 within the hole 245. This can cause non-uniform electroplating in the hole 245 and across the workpiece 200. When the seed layer 250 is deficient, it is preferably enhanced using a process that fills voids or noncontinuous regions of the seed layer 250 to form a more uniform seed layer. Referring to FIG. 2J, for example, voids 251 and/or noncontinuous regions of the seed layer 250 have been filled with additional material 252, such as copper or another suitable material. One suitable seed layer enhancement process is described in U.S. Pat. No. 6,197,181, which is incorporated herein by reference.

Referring next to FIG. 2K, a resist layer 260 is deposited onto the seed layer 250 and patterned to have an opening 261 over the terminal 222 and corresponding hole 245. A first conductive layer 254 is then deposited onto the exposed portions of the seed layer 250 in the hole 245. The first conductive layer 254 can be Cu that is deposited onto the seed layer 250 in an electroless plating operation, electroplating operation, or another suitable method. In the illustrated embodiment, the thickness of the first conductive layer 254 is about 1 micron. In other embodiments, the first conductive layer 254 may include other suitable materials and/or have a different thickness.

Referring to FIG. 2L, a second conductive layer 256 is deposited onto the first conductive layer 254 in the hole 245. The second conductive layer 256 is a wetting agent that facilitates depositing subsequent materials into the hole 245. The second conductive layer 256 can be Ni that is deposited onto the first conductive layer 254 using an electroless or electrolytic plating process. In the illustrated embodiment, the thickness of the second conductive layer 256 is approximately 3-5 microns. In other embodiments, the hole 245 may be coated with other suitable materials using other methods and/or have a different thickness.

Referring next to FIG. 2M, a vent hole 270 is formed in the substrate 212 extending from a bottom portion of the hole 245 to the second side 216 of the substrate 212. The vent hole 270 can be formed using a laser to cut through the substrate 212 from the second side 216 to the bottom of the hole 245. The laser can be aligned with the hole 245 and/or corresponding terminal 222 using scanning/alignment systems known in the art. A suitable laser is the Xise 200 commercially available from Xsil Ltd. of Dublin, Ireland. After forming the vent hole 270, the hole 270 is generally cleaned to remove ablated byproducts (i.e., slag) and/or other undesirable byproducts resulting from the laser. For example, the vent hole 270 can be cleaned using a suitable cleaning agent, such as 6% tetramethylammonium hydroxide (TMAH): propylene glycol. In other embodiments, the vent hole 270 may not be cleaned. In alternative embodiments, the vent hole 270 can be a different size or shape, and may be formed using an etching process (e.g., a dry etch and/or a wet etch), a mechanical drilling process, a dicing or laser slot, or another suitable method. In embodiments in which the hole 245 is a through hole, the substrate may not include a vent hole.

In several embodiments, a temporary protective filling or coating 269 (shown in broken lines) can be deposited into the hole 245 before forming the vent hole 270. The protective filling 269 can be a photoresist, a polymer, water, a solidified liquid or gas, or another suitable material. The protective filling 269 protects the sidewalls of the hole 245 from slag produced during the laser drilling process. The slag can negatively affect the plating of Ni onto the seed layer 250 and/or the wetting of a conductive fill material into the hole 245. The protective filling 269 can be removed after forming the vent hole 270.

Referring next to FIG. 2N, a conductive fill material 280 is deposited into the hole 245 to form an interconnect 282. The interconnect 282 has a first end 283 proximate to the terminal 222 and a second end 284 at the bottom of the hole 245. The fill material 280 can include Cu, Ni, Co, Ag, Au, SnAgCu solder, AuSn solder, a solder having another composition, or other suitable materials or alloys of materials having the desired conductivity. The conductive fill material 280 can be deposited into the blind hole 245 using plating processes, solder wave processes, screen printing processes, reflow processes, vapor deposition processes, or other suitable techniques. The plating processes, for example, can be electroless plating processes or electroplating processes. In several embodiments, the barrier layer 236 and/or seed layer 250 can be used as electroplating contacts.

Referring to FIG. 2O, the resist layer 260 is removed from the workpiece 200 and a suitable etching process is used to remove the remaining portions of the seed layer 250 and the barrier layer 236 on the first surface 235 of the second dielectric layer 232. A first surface 201 of the workpiece 200 can then be planarized using grinding, chemical-mechanical planarization (CMP), and/or other suitable processes.

FIG. 2P is a side cross-sectional view of the workpiece 200 with multiple interconnects 282 formed at corresponding terminals 222 of the dies 220. Referring to FIG. 2Q, the workpiece 200 can be thinned to a desired thickness T to expose the second ends 284 of the interconnects 282. In one embodiment, the initial thickness of the substrate 212 is approximately 750 microns, and the final thickness T is approximately 100-500 microns. The initial and final thicknesses can be different in other embodiments. The second side 216 of the substrate 212 can be thinned by grinding, dry etching, chemical etching, chemical polishing, CMP, or other suitable processes.

The general knowledge of the art before the present invention understood that undercutting into a substrate when forming a through-wafer interconnect hole was undesirable for several reasons. First, undercutting into the substrate increased the time necessary to etch through the oxide or first dielectric layer. Second, the undercut was difficult to cover with dielectric material and increased the likelihood that the interconnect would contact the substrate and cause a short. Third, the undercut could collect containments that cause defects in the devices. As a result, conventional processes of forming through-wafer interconnects did not include undercutting the substrate.

The present inventors, however, have discovered that forming an undercut in a substrate when forming a through-wafer interconnect can be advantageous in certain applications. For example, one advantage of several embodiments of the method for forming interconnects 282 illustrated in FIGS. 2A-2Q is that the resulting interconnect 282 is electrically isolated from the substrate 212. Specifically, the illustrated method forms a hole 245 with an undercut portion 247 at the interface of the first dielectric layer 230 and the substrate 212, and deposits a third dielectric layer 234 in the hole 245. When portions of the third dielectric layer 234 are removed from the terminal 222 and the first surface 235 of the second dielectric layer 232, the portion of the third dielectric layer 234 in the undercut portion 247 of the hole 245 is either not removed or the removed material is insufficient to expose the substrate 212. Because the portion of the substrate 212 in the hole 245 is covered by the third dielectric layer 234 and not exposed, the substrate 212 is electrically isolated from the interconnect 282, which prevents shorting between the substrate 212 and the terminal 222.

Moreover, the method illustrated in FIGS. 2A-2Q forms an interconnect 282 that is electrically isolated from the substrate 212 without significantly increasing the processing time. In several applications, the processing time is expected to be faster than the time required in conventional methods because the time spent forming the undercut portion 247 reduces the time required to form the remainder of the hole 245 in the substrate 212.

Figure 3A:
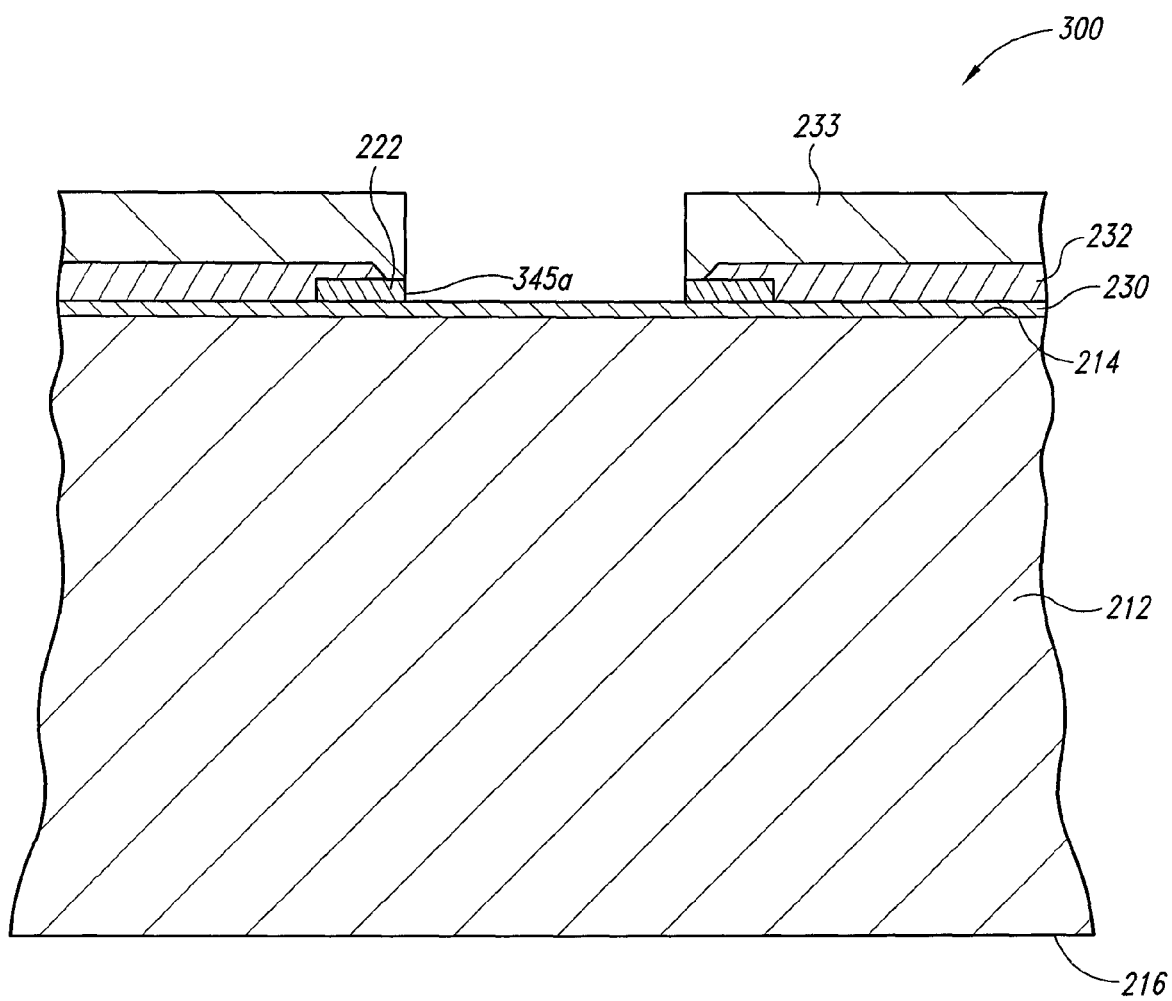
FIGS. 3A-3G are side cross-sectional views illustrating stages of a method for forming electrically conductive interconnects in a microfeature workpiece in accordance with another embodiment of the invention.

C. Additional Embodiments of Methods for Forming Interconnects in Microfeature Workpieces FIGS. 3A-3G illustrate stages in a method for forming interconnects in a microfeature workpiece 300 in accordance with another embodiment of the invention. FIG. 3A, for example, is a side cross-sectional view of a portion of the workpiece 300 at an initial stage before the interconnects have been formed. In previous process steps, such as the steps described above with reference to FIGS. 2A-2C, first and second dielectric layers 230 and 232 have been deposited onto the substrate 212, and a first hole section 345a has been formed through the terminal 222.

Figure 3B:
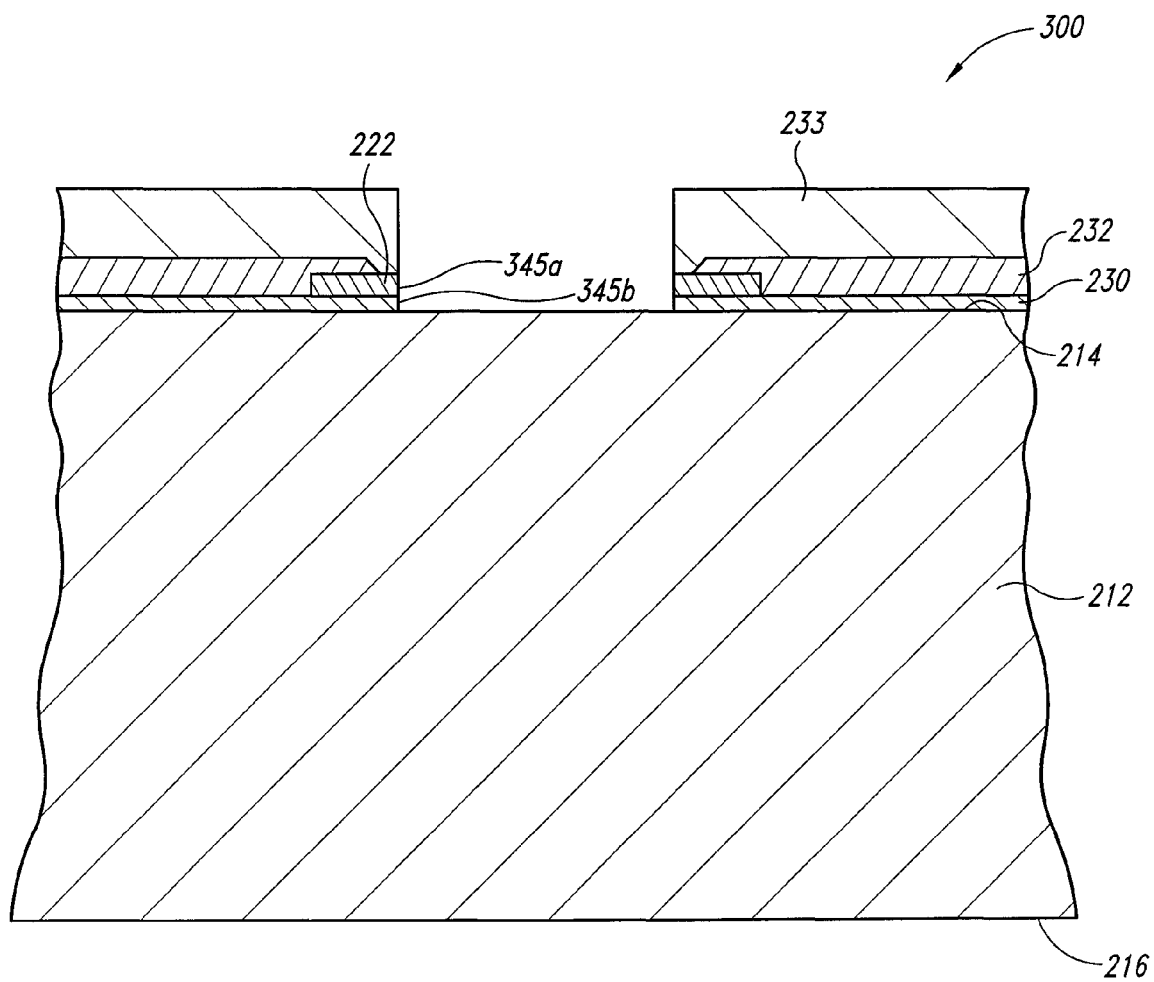
Figure 3C:
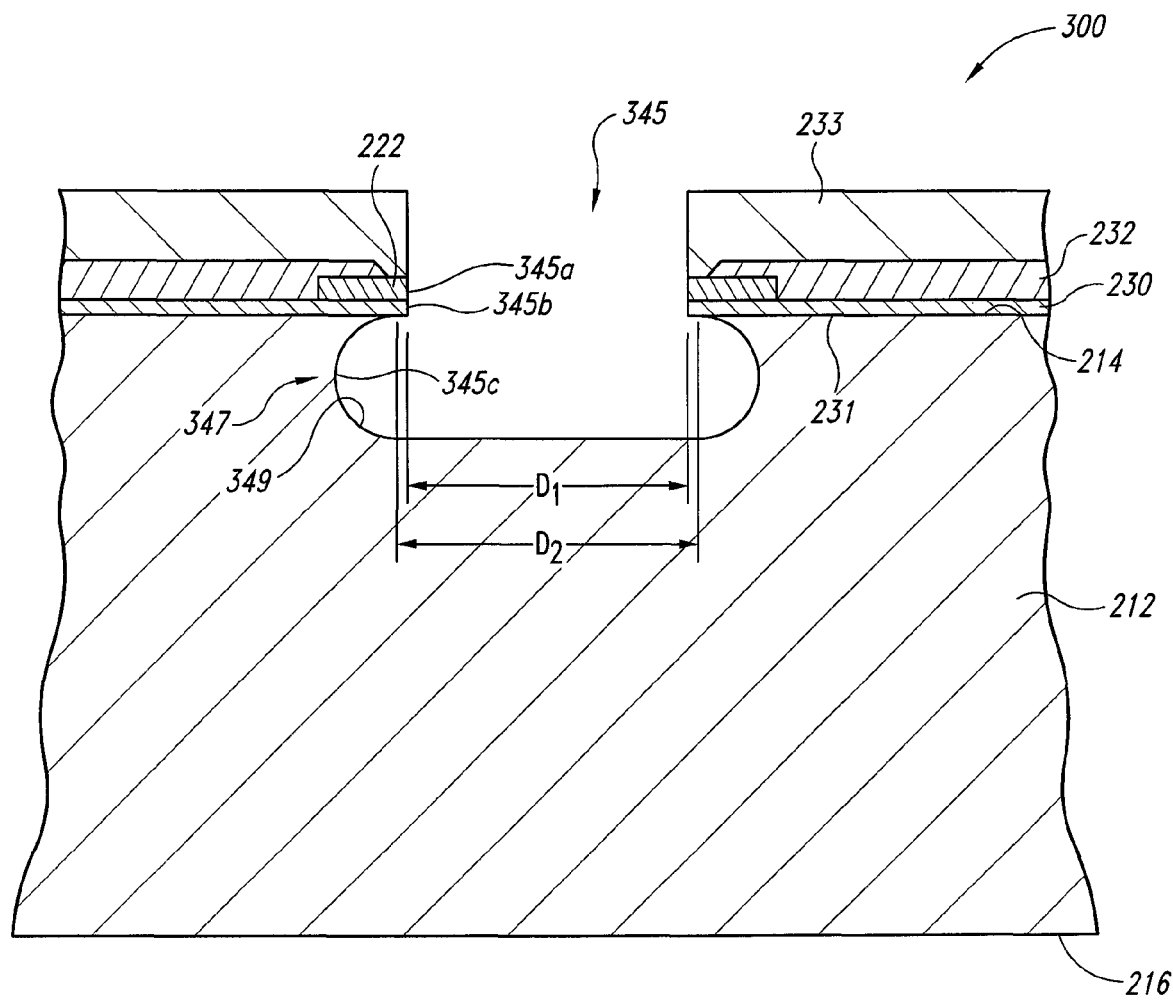

Referring to FIG. 3B, the first dielectric layer 230 directly beneath the terminal 222 is etched to expose at least a portion of the substrate 212 and form a second hole section 345b generally aligned with the first hole section 345a. The second etching process for removing material from the first dielectric layer 230 can be different than the first etching process for removing material from the terminal 222. For example, the second etching process can selectively remove material from the first dielectric layer 230 at a higher etch rate than from either the terminal 222 or the substrate 212. The second etching process accordingly does not significantly alter the general structure of the terminal 222 or the substrate 212. In other embodiments, however, material can be removed from the terminal 222 and the first dielectric layer 230 in a single etching process.

FIGS. 3C-3G illustrate a technique, typically referred to as a Bosch process, for forming a hole 345 in the substrate 212. Beginning with FIG. 3C, the mask 233 is used again on the workpiece 300 to form a third hole section 345c through a portion of the substrate 212 in a first etching cycle. The second hole section 345b has a first diameter $D_1$, and the third hole section 345c has a second diameter $D_2$ at the interface between the first dielectric layer 230 and the substrate 212. The second diameter $D_2$ is greater than the first diameter $D_1$ such that the third hole section 345c forms an undercut portion 347 in the substrate 212 below the first dielectric layer 230 and exposes a back surface 231 of the first dielectric layer 230. As a result, the first dielectric layer 230 forms an overhang over the third hole section 345c. The first etching cycle forms a generally cylindrical sidewall 349 that has a barrel-type shape (exaggerated in the figures for purposes of illustration).

Figure 3D:
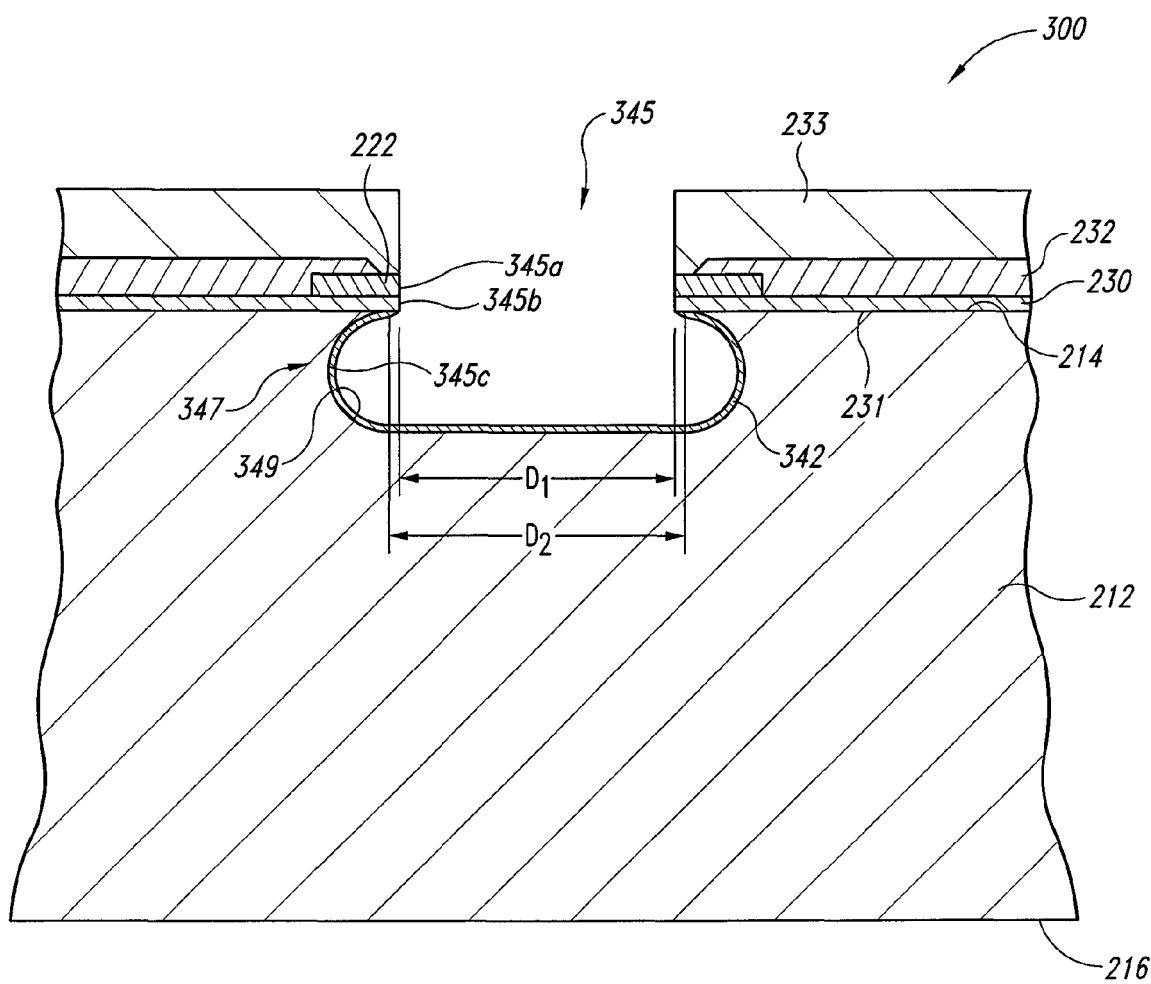

Referring next to FIG. 3D, a third dielectric layer 342 is formed on the sidewall 349 to passivate the third hole section 345c in the substrate 212. The third dielectric layer 342 can be a teflon-like polymer or other suitable materials. The third dielectric layer 342 accordingly inhibits the third hole section 345c from becoming further widened as the hole 345 is deepened.

Figure 3E:
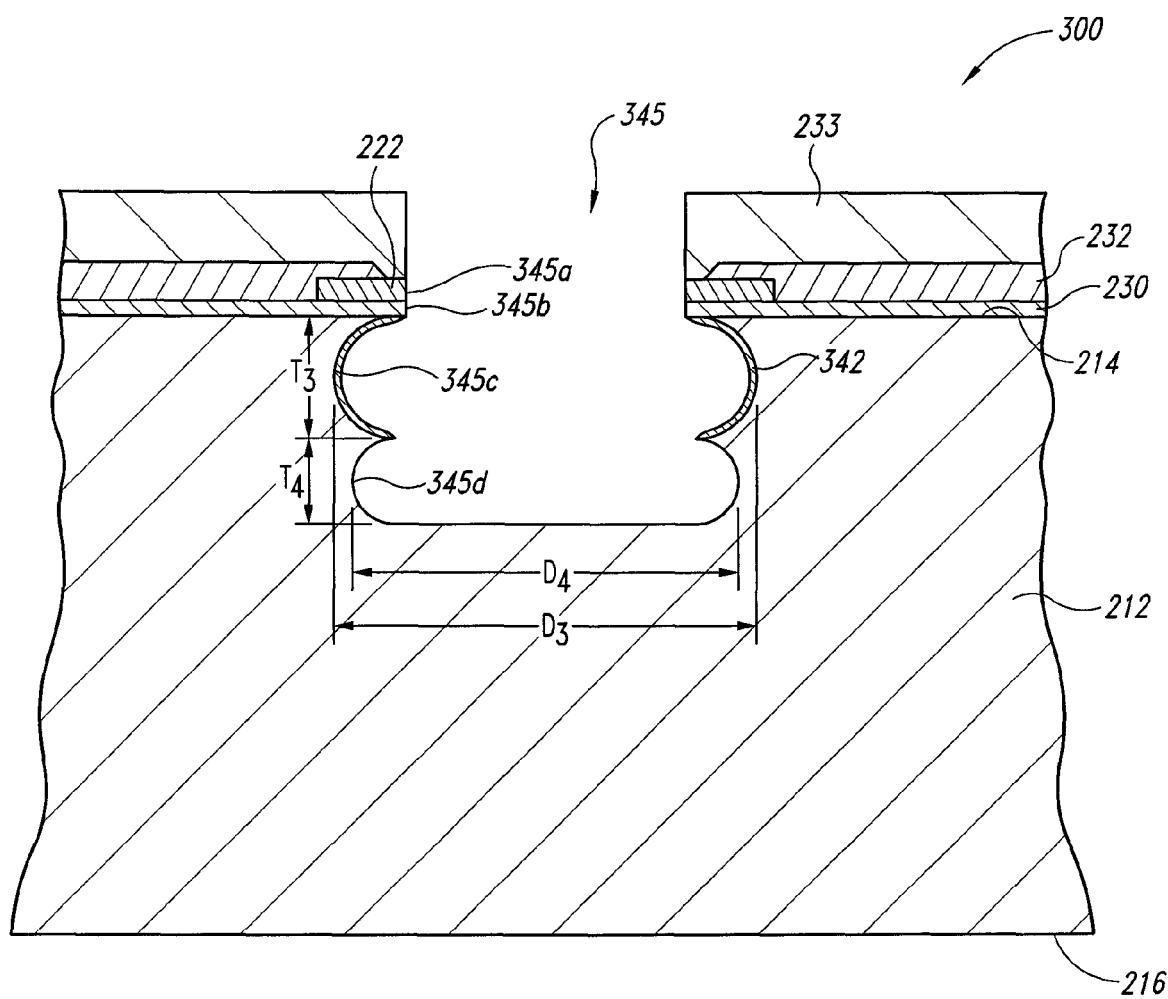

Referring next to FIG. 3E, a fourth hole section 345d has been formed in the substrate 212 below the third hole section 345c by a second etching cycle. In the illustrated embodiment, the third hole section 345c has a third major lateral dimension $D_3$ and a third depth $T_3$, and the fourth hole section 345d has a fourth major lateral dimension $D_4$ less than the third major lateral dimension $D_3$ and a fourth depth $T_4$ less than the third depth $T_3$. In the illustrated method, the second etching cycle has different process parameters than the first etching cycle that formed the third hole section 345c. For example, the first etching cycle can include exposing the substrate 212 to an etchant (e.g., $SF_6$) for a first process time, and the second etching cycle can include exposing the substrate 212 to the etchant for a second process time less than the first process time. In other embodiments, the first and second etching cycles can have the same exposure time but use different etchants or vary other process parameters. In additional embodiments, the first and second etching cycles can be generally the same, and the third and fourth hole sections 345c-d have generally the same size.

Figure 3F:
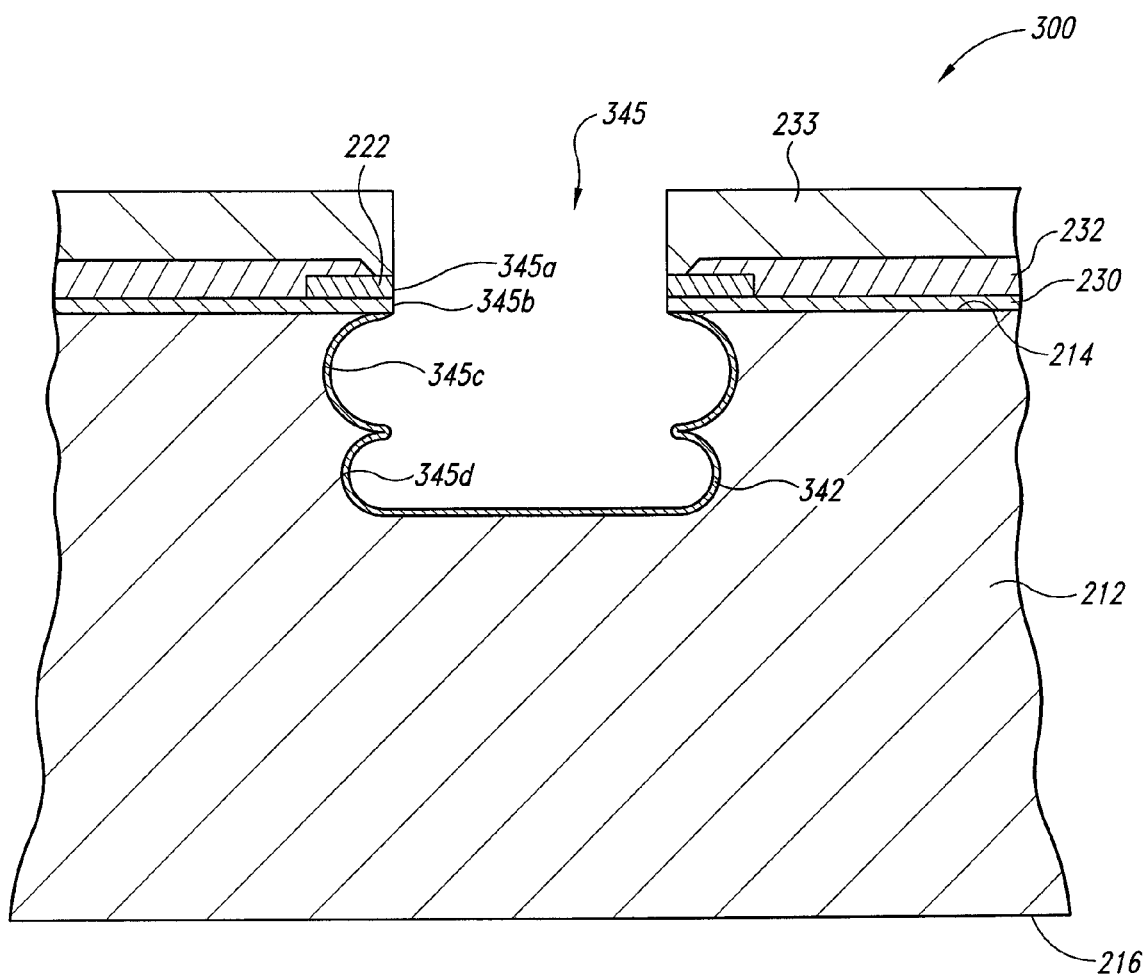
Figure 3G:
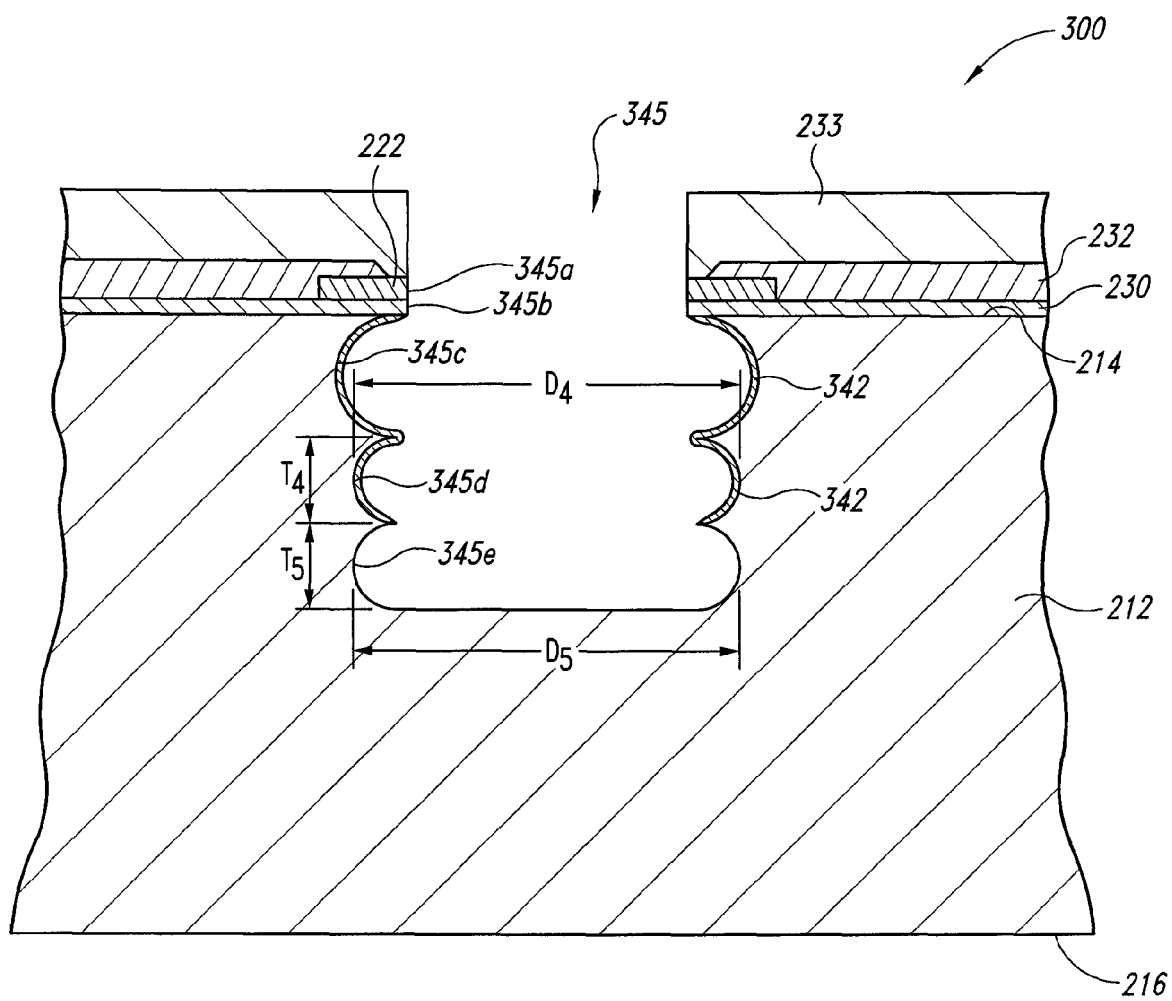

Referring to FIG. 3F, the third dielectric layer 342 is again applied to coat the newly formed fourth hole section 345d and inhibit the section 345d from becoming further widened as the hole 345 is deepened. Referring to FIG. 3G, a fifth hole section 345e has been formed in the substrate 212 below the fourth hole section 345d by a third etching cycle. The fifth hole section 345e has a fifth major lateral dimension $D_5$ generally the same as the fourth major lateral dimension $D_4$ of the fourth hole section 345d, and a fifth depth $T_5$ generally the same as the fourth depth T4. The third etching cycle can be accordingly generally the same as the second etching cycle.

After forming the fifth hole section 345e, the process of applying the dielectric layer 342 to the newly formed hole section and then etching an additional hole section in the substrate 212 can be repeated until the hole 345 extends to a desired depth in the substrate 212. After the hole 345 has been formed to the desired depth in the substrate 212, an interconnect can be formed in the hole 345 as described above with reference to FIGS. 2H-2Q.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A microfeature workpiece, comprising:
   a substrate;
   a dielectric layer on the substrate;
   a microelectronic die formed in and/or on the substrate, the die including a terminal on the dielectric layer and an integrated circuit operably coupled to the terminal; and
   a hole extending through the terminal and the dielectric layer to at least an intermediate depth in the substrate, the hole having a first lateral dimension in the dielectric layer and a second lateral dimension in the substrate at an interface between the dielectric layer and the substrate, the second lateral dimension being greater than the first lateral dimension, and wherein the hole has a third lateral dimension in a portion of the substrate spaced apart from the interface between the dielectric layer and the substrate, the third lateral dimension being less than the second lateral dimension.

2. The microfeature workpiece of claim 1 wherein:
   the dielectric layer comprises a first surface contacting the substrate; and
   the hole is configured to expose a portion of the first surface of the dielectric layer.

3. The microfeature workpiece of claim 1 wherein the hole comprises an undercut portion in the substrate at the interface between the dielectric layer and the substrate.

4. The microfeature workpiece of claim 1, further comprising an electrically conductive interconnect in the hole and contacting the terminal.

5. The microfeature workpiece of claim 1, further comprising an electrically conductive interconnect in the hole and contacting the terminal, wherein the electrically conductive interconnect is electrically isolated from the substrate.

6. The microfeature workpiece of claim 1 wherein the hole comprises a blind hole that does not extend completely through the substrate.

7. The microfeature workpiece of claim 1 wherein the hole comprises a through hole that extends completely through the substrate.

8. The microfeature workpiece of claim 1 wherein the dielectric layer is a first dielectric layer, wherein the hole comprises a portion in the substrate at the interface between the dielectric layer and the substrate, and wherein the microfeature workpiece further comprises a second dielectric layer in at least the portion of the hole in the substrate.

9. The microfeature workpiece of claim 1 wherein the hole comprises a first hole section in the substrate at the interface between the dielectric layer and the substrate and a second hole section in the substrate adjacent to the first hole section, and wherein the first hole section has a major third lateral dimension and the second hole section has a major fourth lateral dimension less than the third lateral dimension.

10. The microfeature workpiece of claim 1 wherein the hole comprises a blind hole, and wherein the workpiece further comprises a vent in fluid communication with the blind hole.

11. The microfeature workpiece of claim 1 wherein the hole comprises a first section in the substrate at the interface between the dielectric layer and the substrate and a second section in the substrate adjacent to the first section, and wherein the first section has a first depth and the second section has a second depth less than the first depth.

12. A microfeature workpiece, comprising:
a substrate having a substrate surface;
a dielectric layer on the substrate surface;
a terminal on the dielectric layer;
an operable microelectronic feature carried by the substrate and operably coupled to the terminal; and
an interconnect via extending through the terminal and the dielectric layer to at least an intermediate depth in the substrate, the interconnect via including an undercut portion in the substrate proximate an interface between the dielectric layer and the substrate, the undercut portion being at a first depth from the substrate surface and having a first diameter, wherein the interconnect via also includes a hole portion proximate the undercut portion and extending into the substrate, the hole portion being at a second depth greater than the first depth, and wherein the hole portion has a second diameter smaller than the first diameter.

13. The microfeature workpiece of claim 12 wherein the interconnect via has a first lateral dimension in the dielectric layer and a second lateral dimension in the substrate at an interface between the dielectric layer and the substrate, the second lateral dimension being greater than the first lateral dimension.

14. The microfeature workpiece of claim 12 wherein:
the dielectric layer comprises a first surface contacting the substrate; and
the interconnect via is configured to expose a portion of the first surface of the dielectric layer.

15. The microfeature workpiece of claim 12, further comprising an electrically conductive interconnect in the interconnect via and contacting the terminal.

16. The microfeature workpiece of claim 12, further comprising an electrically conductive interconnect in the interconnect via and contacting the terminal, wherein the electrically conductive interconnect is electrically isolated from the substrate.

17. The microfeature workpiece of claim 12 wherein the interconnect via has a first major lateral dimension in the undercut portion of the substrate and a second major lateral dimension in a first portion of the substrate adjacent to the undercut portion, the second dimension being less than the first dimension.

18. The microfeature workpiece of claim 12 wherein the dielectric layer is a first dielectric layer, and wherein the microfeature workpiece further comprises a second dielectric layer in at least the section of the interconnect via in the substrate.

19. The microfeature workpiece of claim 12 wherein the interconnect via comprises a blind hole, and wherein the workpiece further comprises a vent in fluid communication with the blind hole.

20. The microfeature workpiece of claim 12 wherein the interconnect via comprises a first section in the substrate at the interface between the dielectric layer and the substrate and a second section in the substrate adjacent to the first section, and wherein the first section has a first depth and the second section has a second depth less than the first depth.

21. A microfeature workpiece, comprising:
a substrate;
a dielectric layer on the substrate;
a semiconductor die formed in and/or on the substrate, the semiconductor die including a terminal on the dielectric layer and an integrated circuit operably coupled to the terminal;
an aperture extending through the terminal and the dielectric layer into the substrate, the aperture having a first lateral dimension in the dielectric layer and a second lateral dimension in the substrate at an interface between the dielectric layer and the substrate, the second lateral dimension being greater than the first lateral dimension, and wherein the aperture has a third lateral dimension in a portion of the substrate spaced apart from the interface between the dielectric layer and the substrate, the third lateral dimension being less than the second lateral dimension; and
a conductive fill material substantially filling the aperture and in contact with the terminal.

22. The microfeature workpiece of claim 21 wherein the aperture comprises an undercut portion in the substrate at the interface between the dielectric layer and the substrate.

23. The microfeature workpiece of claim 21 wherein the dielectric layer is a first dielectric layer, wherein the aperture comprises an undercut in the substrate at the interface between the dielectric layer and the substrate, and wherein the microfeature workpiece further comprises a second dielectric layer substantially filing the undercut portion of the aperture.

24. The microfeature workpiece of claim 21 wherein the aperture comprises a first section in the substrate at the interface between the dielectric layer and the substrate and a second section in the substrate adjacent to the first section, and wherein the first section has a major third lateral dimension and the second section has a major fourth lateral dimension less than the third lateral dimension.

* * * * *